(12) United States Patent　　(10) Patent No.: US 8,510,598 B2
Vedder et al.　　(45) Date of Patent: ＊Aug. 13, 2013

(54) BUFFER MANAGEMENT METHOD AND APPARATUS FOR POWER REDUCTION DURING FLUSH OPERATION

(75) Inventors: Rex Weldon Vedder, Boulder, CO (US); Bradford Edwin Golson, Boulder, CO (US); Michael Joseph Peters, Fort Collins, CO (US)

(73) Assignee: Dot Hill Systems Corporation, Longmont, CO (US)

( * ) Notice: Subject to any disclaimer, the term of this patent is extended or adjusted under 35 U.S.C. 154(b) by 345 days.

This patent is subject to a terminal disclaimer.

(21) Appl. No.: 13/012,390

(22) Filed: Jan. 24, 2011

(65) Prior Publication Data

US 2011/0239043 A1　Sep. 29, 2011

Related U.S. Application Data

(60) Provisional application No. 61/318,759, filed on Mar. 29, 2010.

(51) Int. Cl.
*G06F 11/00*　(2006.01)
(52) U.S. Cl.
USPC .............................. 714/22; 714/14; 713/320
(58) Field of Classification Search
USPC ................................ 714/22, 24, 14; 713/320
See application file for complete search history.

(56) References Cited

U.S. PATENT DOCUMENTS

| | | | |
|---|---|---|---|
| 4,458,307 A * | 7/1984 | McAnlis et al. | 714/22 |
| 5,241,508 A * | 8/1993 | Berenguel et al. | 365/229 |
| 5,414,861 A * | 5/1995 | Horning | 365/229 |
| 5,886,945 A | 3/1999 | Pascucci | |
| 6,029,250 A | 2/2000 | Keeth | |
| 6,061,296 A | 5/2000 | Ternullo et al. | |
| 6,370,068 B2 | 4/2002 | Rhee | |
| 6,434,736 B1 | 8/2002 | Schaecher et al. | |
| 6,460,125 B2 | 10/2002 | Lee et al. | |
| 6,735,122 B2 | 5/2004 | Rookparvar | |
| 6,745,275 B2 | 6/2004 | Chang | |
| 6,763,478 B1 | 7/2004 | Bui | |

(Continued)

OTHER PUBLICATIONS

Wikipedia's "Synchronous dynamic random access memory" retrieved Jan. 26, 2011. http://en.wikipedia.org/wiki/Synchronous_dynamic_random_access_memory.

(Continued)

*Primary Examiner* — Yolanda L Wilson
(74) *Attorney, Agent, or Firm* — Thomas J. Lavan

(57) ABSTRACT

A method for providing reduced power consumption in a computer memory system is provided. The method includes transferring, by a memory controller coupled to a volatile memory, a non-volatile memory, and a buffer, first data from the volatile memory to the buffer. The buffer stores less data than the volatile memory and the non-volatile memory. The method also includes placing the volatile memory into self-refresh mode after transferring the first data to the buffer. The method further includes conveying the first data from the buffer to the non-volatile memory, where the amount of first data exceeds a predetermined threshold. While conveying the first data, the memory controller takes the volatile memory out of self-refresh mode when the amount of first data in the buffer reaches the predetermined threshold. The volatile memory is ready to transfer second data to the buffer when the memory controller is finished transferring the first data.

20 Claims, 24 Drawing Sheets

(56) References Cited

U.S. PATENT DOCUMENTS

| | | | |
|---|---|---|---|
| 6,865,111 B2 | 3/2005 | Rookparvar | |
| 6,870,770 B2 | 3/2005 | Rookparvar | |
| 7,017,061 B2 | 3/2006 | Lippert et al. | |
| 7,031,207 B2 | 4/2006 | Nishioka | |
| 7,042,296 B2 | 5/2006 | Hui et al. | |
| 7,076,674 B2 | 7/2006 | Cervantes | |
| 7,085,944 B1 | 8/2006 | Hamilton | |
| 7,127,626 B2 | 10/2006 | Inaba | |
| 7,190,622 B2 | 3/2007 | Rookparvar | |
| 7,200,711 B2 | 4/2007 | Valin et al. | |
| 7,274,611 B2 | 9/2007 | Rookparvar | |
| 7,289,378 B2 | 10/2007 | Ivanov | |
| 7,388,800 B2 | 6/2008 | Maeda | |
| 7,430,676 B2 | 9/2008 | Baker et al. | |
| 7,432,731 B2 | 10/2008 | Bains et al. | |
| 7,453,746 B2 | 11/2008 | Ivanov | |
| 7,467,255 B2 | 12/2008 | Huang | |
| 7,489,569 B2 | 2/2009 | Ivanov | |
| 7,536,506 B2 | 5/2009 | Ashmore et al. | |
| 7,564,258 B2 | 7/2009 | Nguyen et al. | |
| 7,650,481 B2 | 1/2010 | Walker | |
| 7,741,868 B2 | 6/2010 | Nguyen et al. | |
| 7,827,424 B2 | 11/2010 | Bounitch | |
| 7,895,457 B2 | 2/2011 | Luo et al. | |
| 7,954,006 B1 * | 5/2011 | Mangipudi | 714/22 |
| 8,325,554 B2 | 12/2012 | Sweere et al. | |
| 8,327,172 B2 | 12/2012 | David et al. | |
| 2001/0017368 A1 | 8/2001 | Rhee | |
| 2002/0004893 A1 | 1/2002 | Chang | |
| 2003/0107920 A1 | 6/2003 | Roohparvar | |
| 2003/0128589 A1 | 7/2003 | Roohparvar | |
| 2004/0139362 A1 | 7/2004 | Inaba | |
| 2004/0153582 A1 | 8/2004 | Oyama et al. | |
| 2004/0165444 A1 | 8/2004 | Roohparvar | |
| 2004/0218430 A1 | 11/2004 | Nishioka | |
| 2005/0190193 A1 | 9/2005 | Freker et al. | |
| 2005/0219919 A1 | 10/2005 | Ivanov | |
| 2006/0015683 A1 * | 1/2006 | Ashmore et al. | 711/113 |
| 2006/0033544 A1 | 2/2006 | Hui et al. | |
| 2006/0112250 A1 | 5/2006 | Walker | |
| 2006/0262624 A1 | 11/2006 | Rookparvar | |
| 2007/0007992 A1 | 1/2007 | Bains et al. | |
| 2007/0061536 A1 | 3/2007 | Ivanov | |
| 2007/0133321 A1 | 6/2007 | Ivanov | |
| 2007/0233942 A1 | 10/2007 | Huang | |
| 2007/0290714 A1 | 12/2007 | Nguyen et al. | |
| 2008/0215808 A1 * | 9/2008 | Ashmore et al. | 711/113 |
| 2009/0113158 A1 | 4/2009 | Schnell et al. | |
| 2009/0276559 A1 | 11/2009 | Allen et al. | |
| 2009/0278565 A1 | 11/2009 | Nguyen et al. | |
| 2010/0039875 A1 | 2/2010 | Stott et al. | |
| 2010/0251043 A1 | 9/2010 | Anzou et al. | |
| 2010/0293406 A1 | 11/2010 | Welker et al. | |

OTHER PUBLICATIONS

Wikipedia's "Battery (electricity)" retrieved Jan. 26, 2011. http://en.wikipedia.org/wiki/Battery_(electricity).
Wikipedia's "Non-volatile memory" retrieved Jan. 26, 2011. http://en.wikipedia.org/wiki/Non-volatile_memory.
Wikipedia's "SDRAM latency" retrieved Jan. 16, 2011. http://en.wikipedia.org/wiki/SDRAM_latency.
Wikipedia's "Electric double-layer capacitor" retrieved Jan. 26, 2011. http://en.wikipedia.org/wiki/Supercapacitor.
Related patent U.S. Appl. No. 13/012,299, filed Jan. 24, 2011.
1st office action for related U.S. Appl. No. 13/012,299, dated May 31, 2013.

* cited by examiner

Fig. 5

| | byte lane 0 | byte lane 1 | byte lane 2 | byte lane 3 | byte lane 4 | byte lane 5 | byte lane 6 | byte lane 7 |
|---|---|---|---|---|---|---|---|---|
| delay 0 | fail | fail | fail | fail | fail | fail | fail | fail |
| delay 1 | pass | fail | fail | pass | fail | fail | fail | fail |
| delay 2 | pass | fail | fail | pass | pass | fail | fail | fail |
| delay 3 | pass | pass | fail | pass | pass | pass | fail | fail |
| delay 4 | pass | pass | pass | pass | pass | pass | fail | fail |
| delay 5 | pass | pass | pass | pass | pass | pass | pass | pass |
| delay 6 | pass | pass | pass | fail | pass | fail | pass | pass |
| delay 7 | pass | fail | pass | fail | pass | fail | pass | pass |
| delay 8 | fail | fail | pass | fail | pass | fail | pass | pass |
| delay 9 | fail | fail | pass | fail | fail | fail | pass | fail |
| delay 10 | fail | fail | pass | fail | fail | fail | fail | fail |
| delay 11 | fail | fail | fail | fail | fail | fail | fail | fail |
| delay 12 | fail | fail | fail | fail | fail | fail | fail | fail |
| delay 13 | fail | fail | fail | fail | fail | fail | fail | fail |

Fig. 6   volatile memory calibration
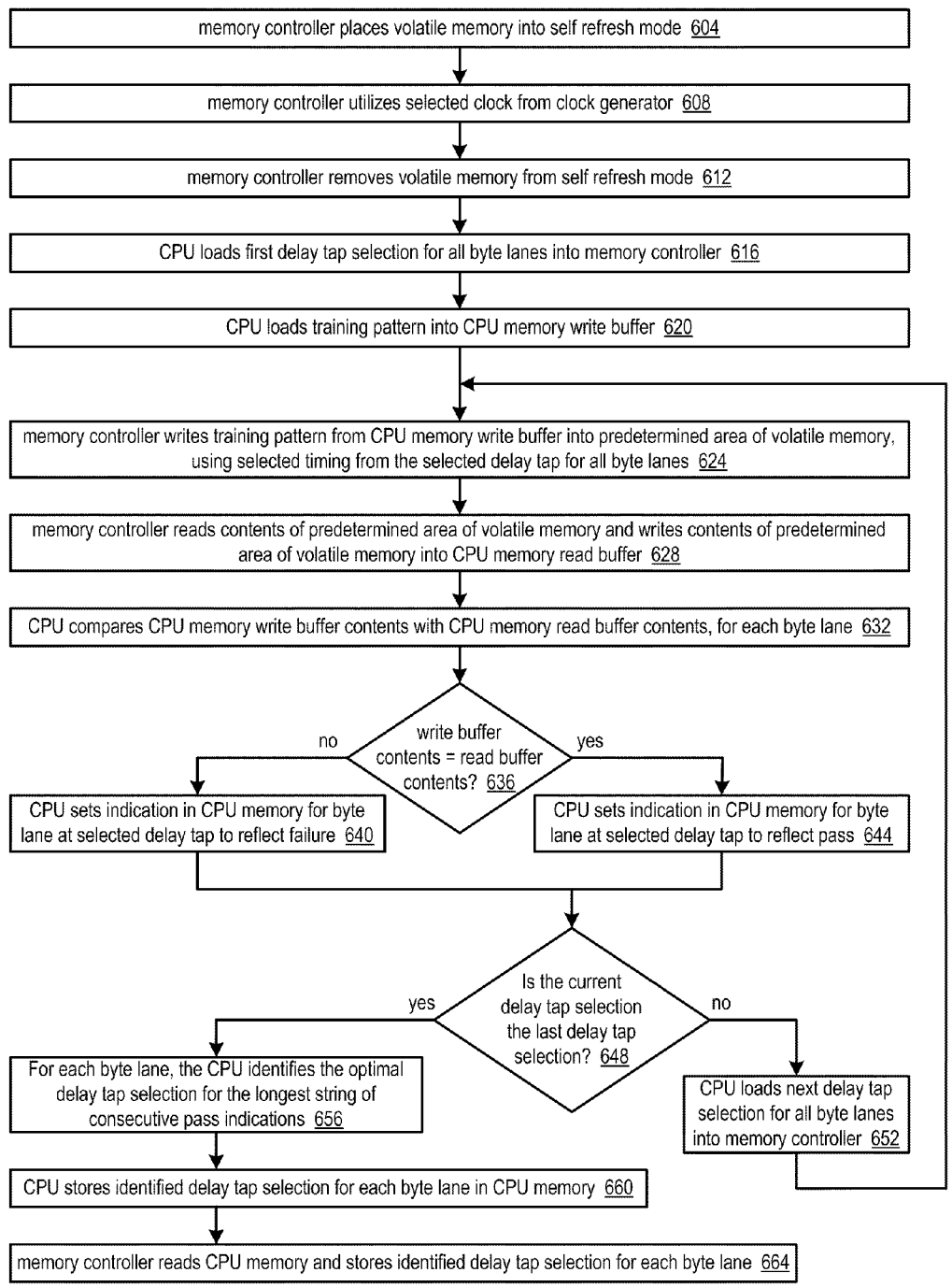

Fig. 8   flush process for single-rank volatile memory
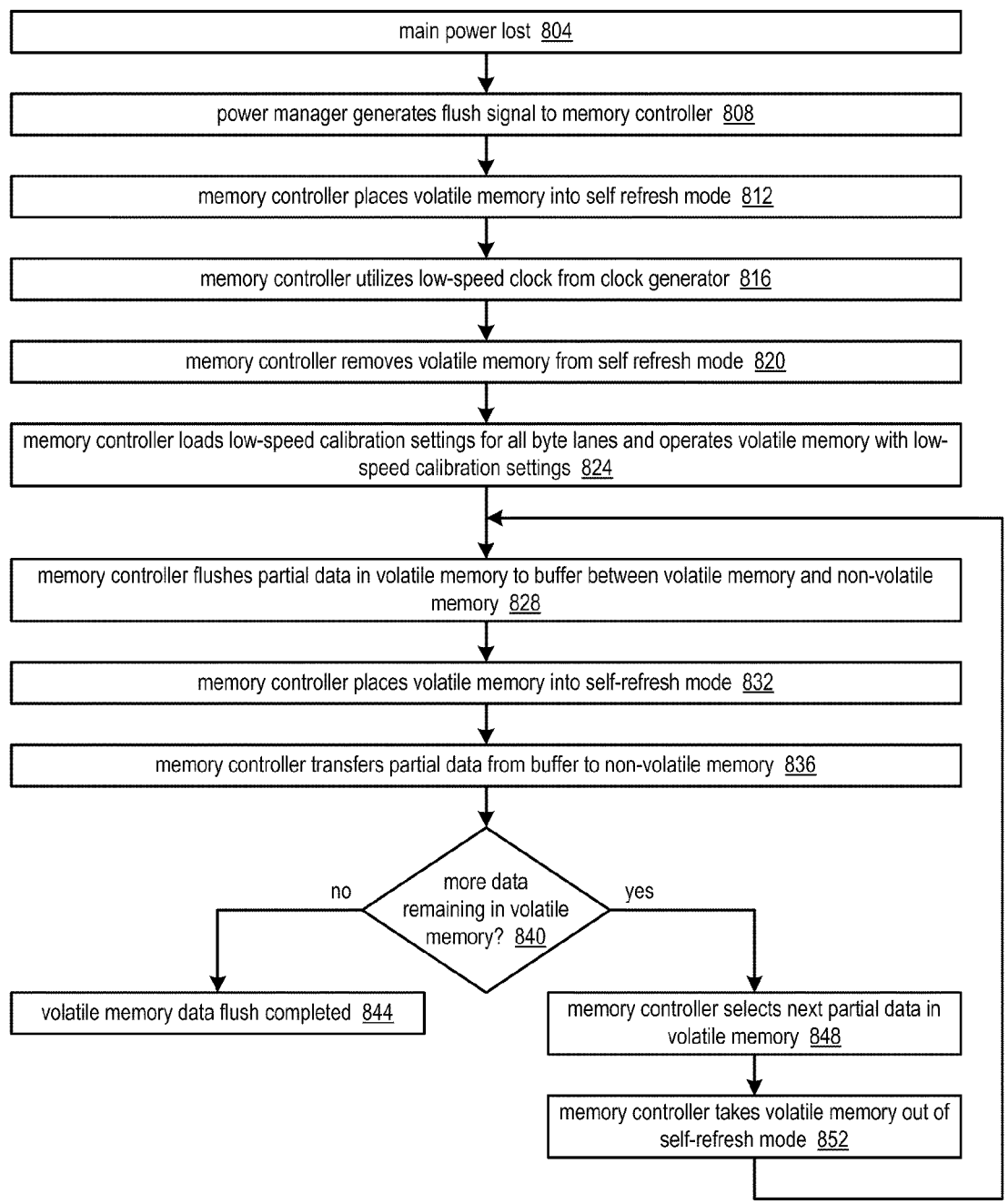

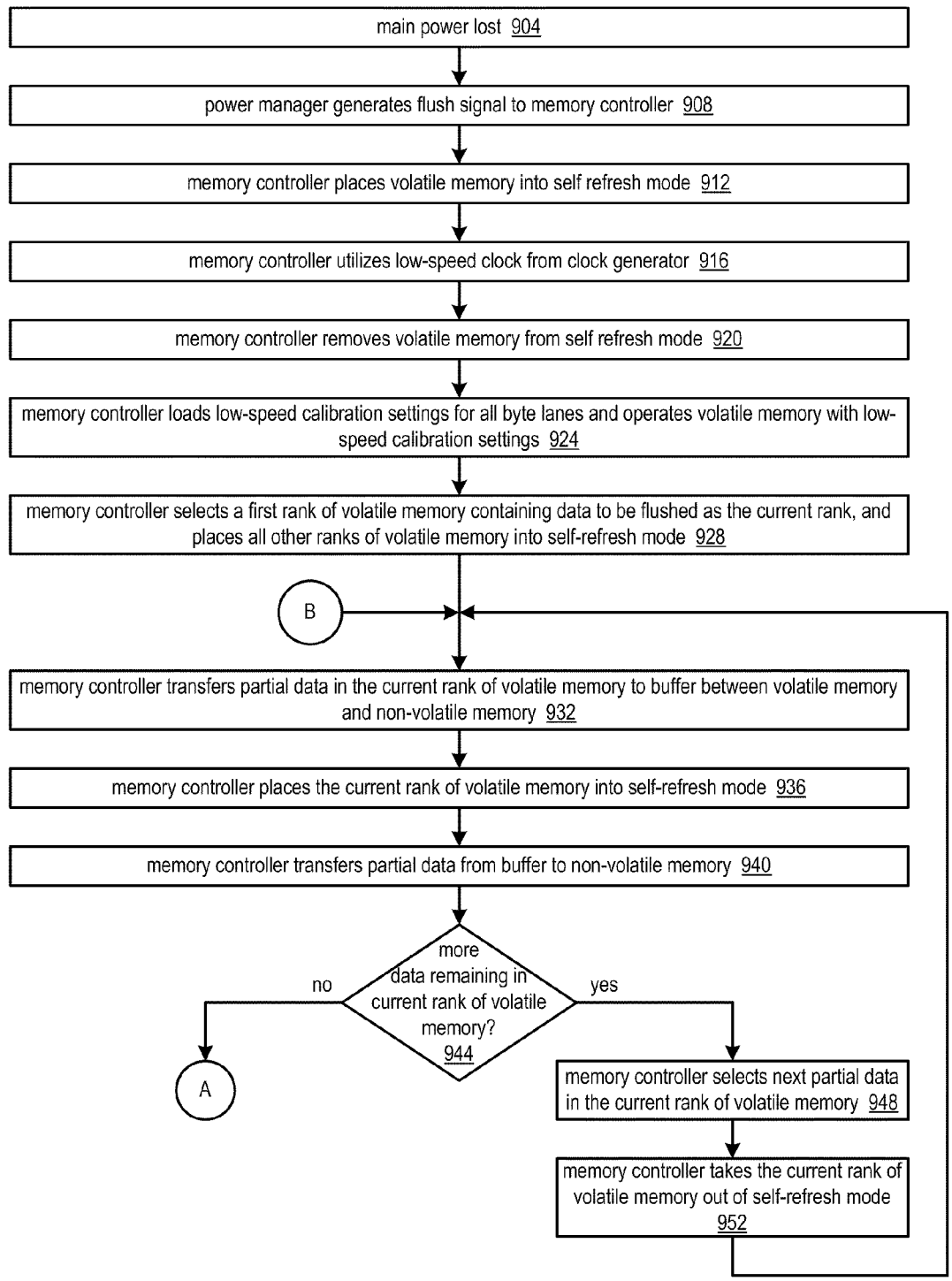
Fig. 9a  flush process for multiple-rank volatile memory

Fig. 9b    flush process for multiple-rank volatile memory (continued)
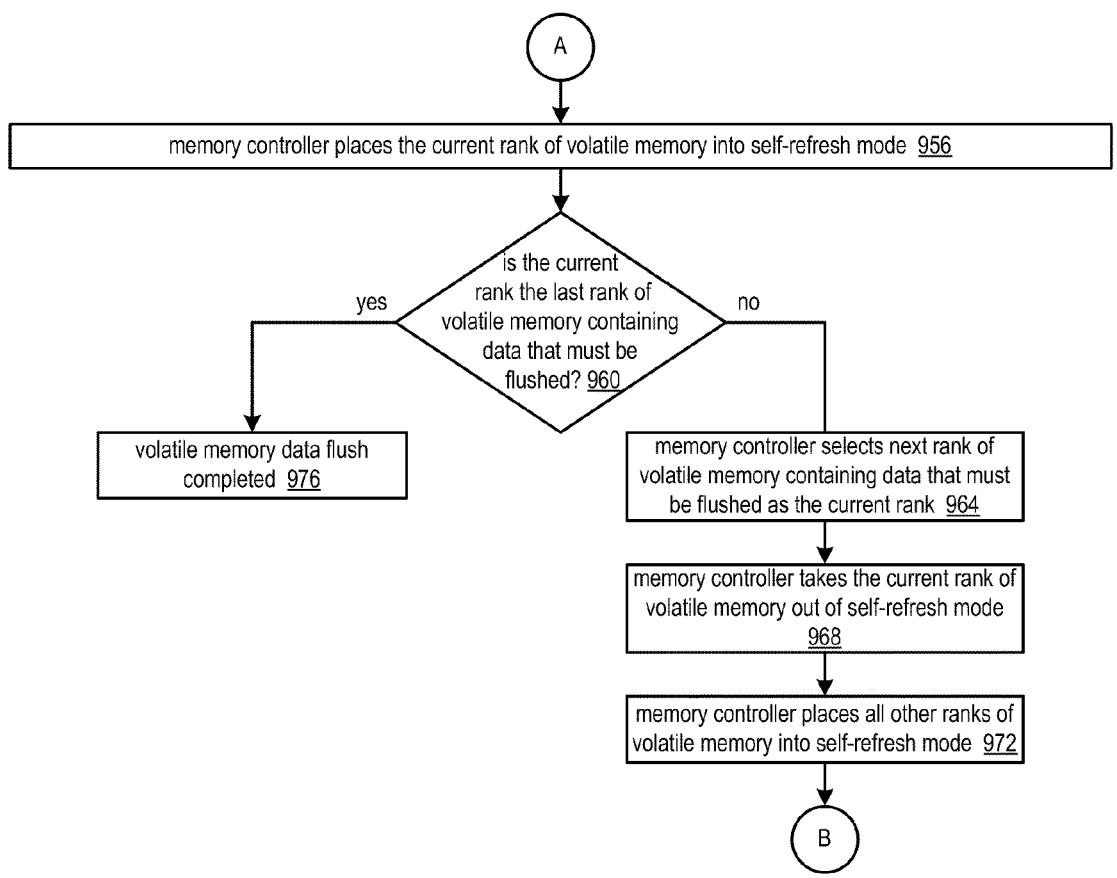

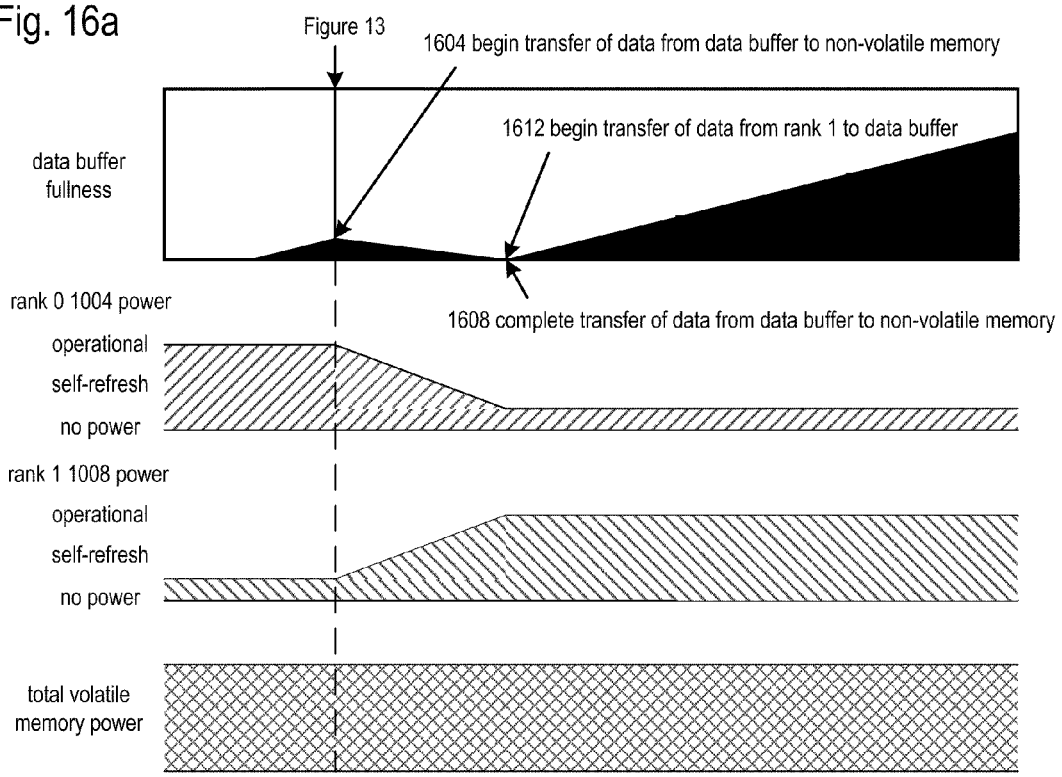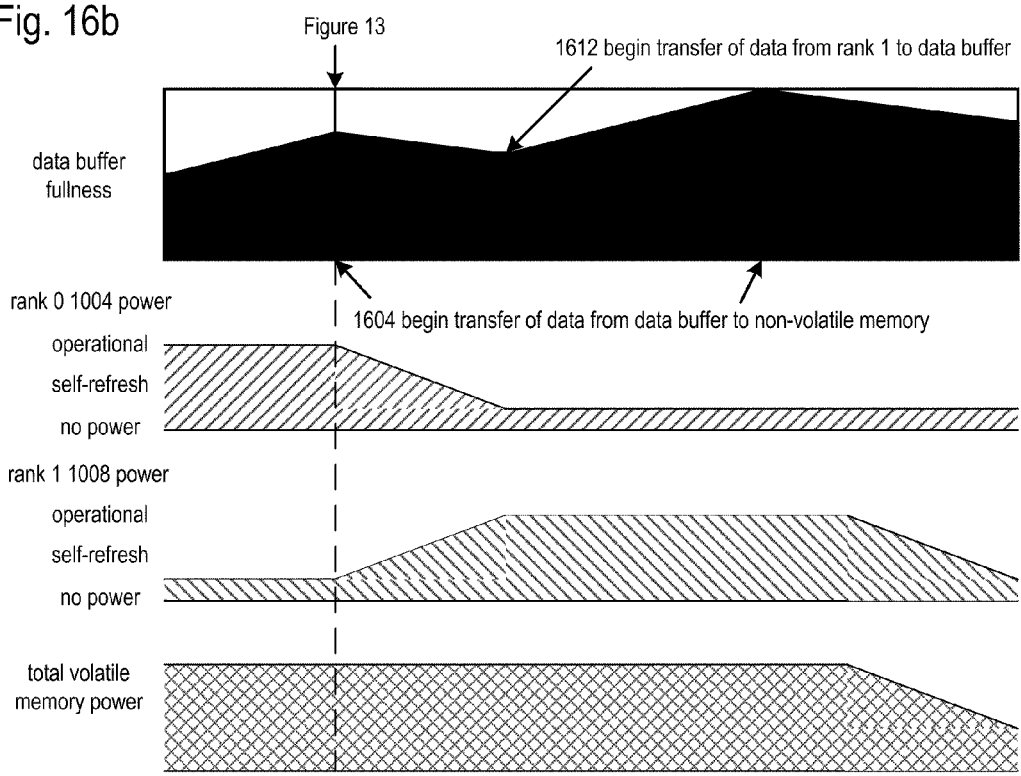

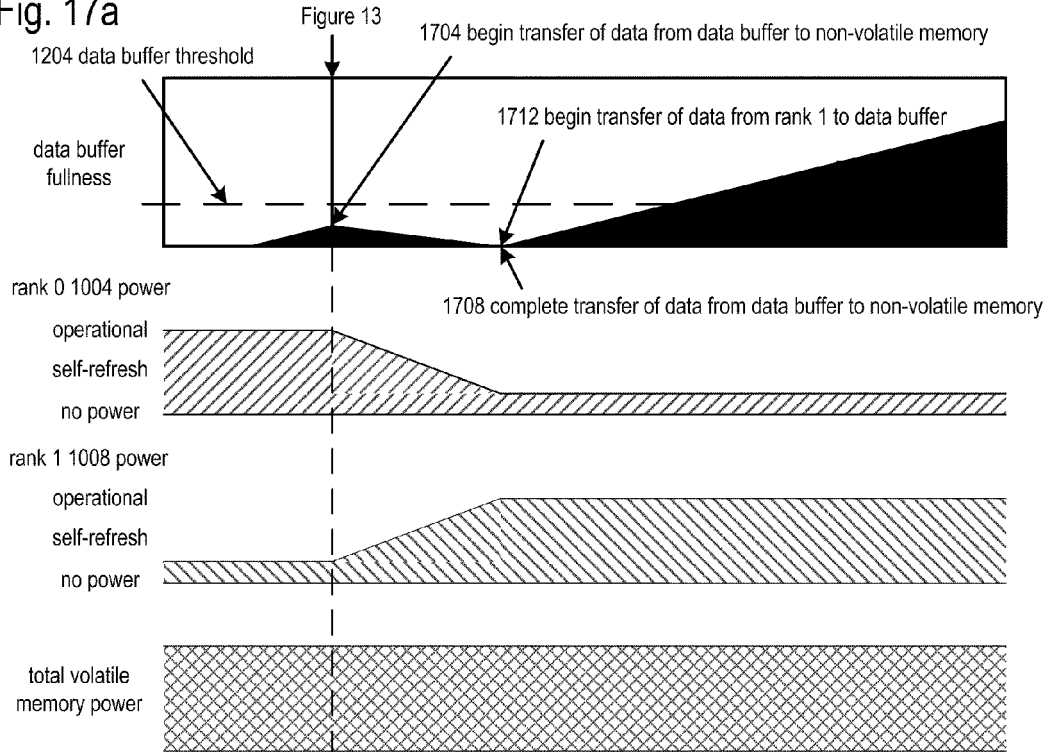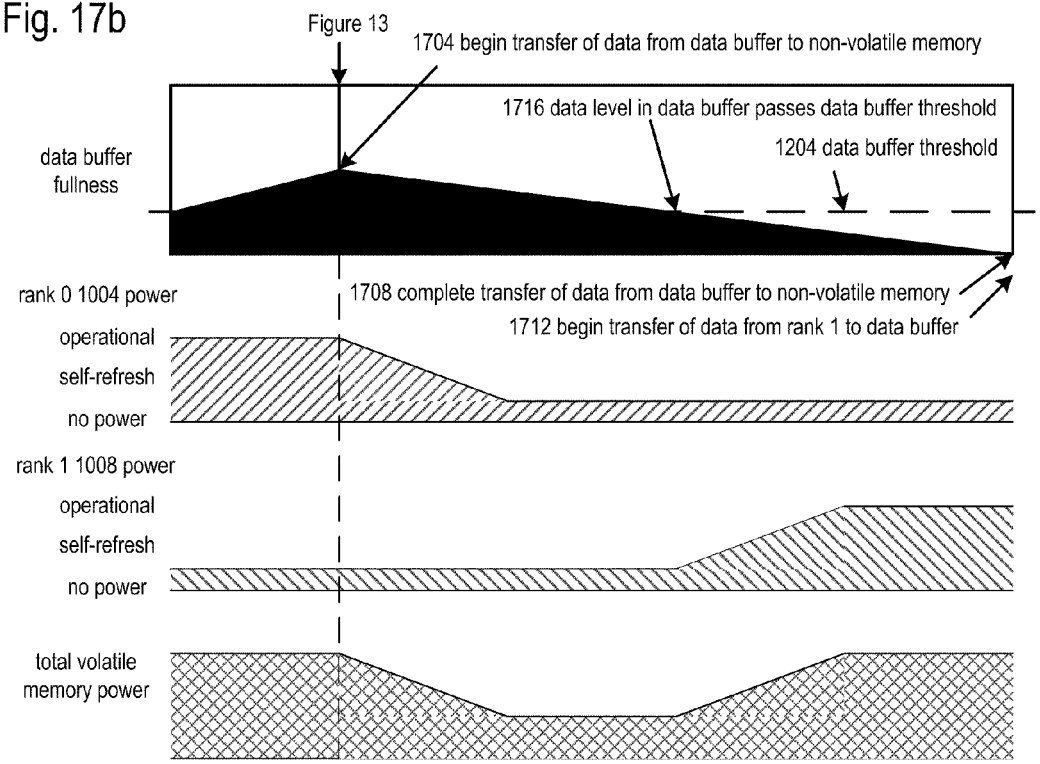

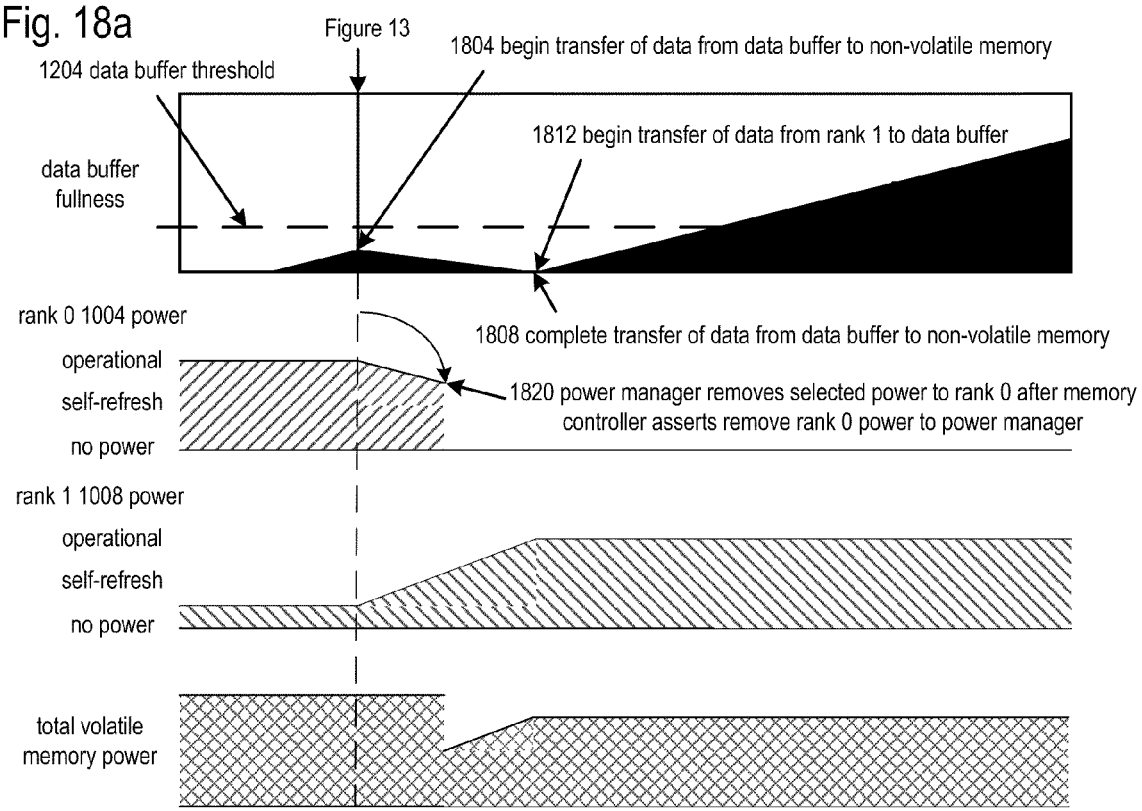
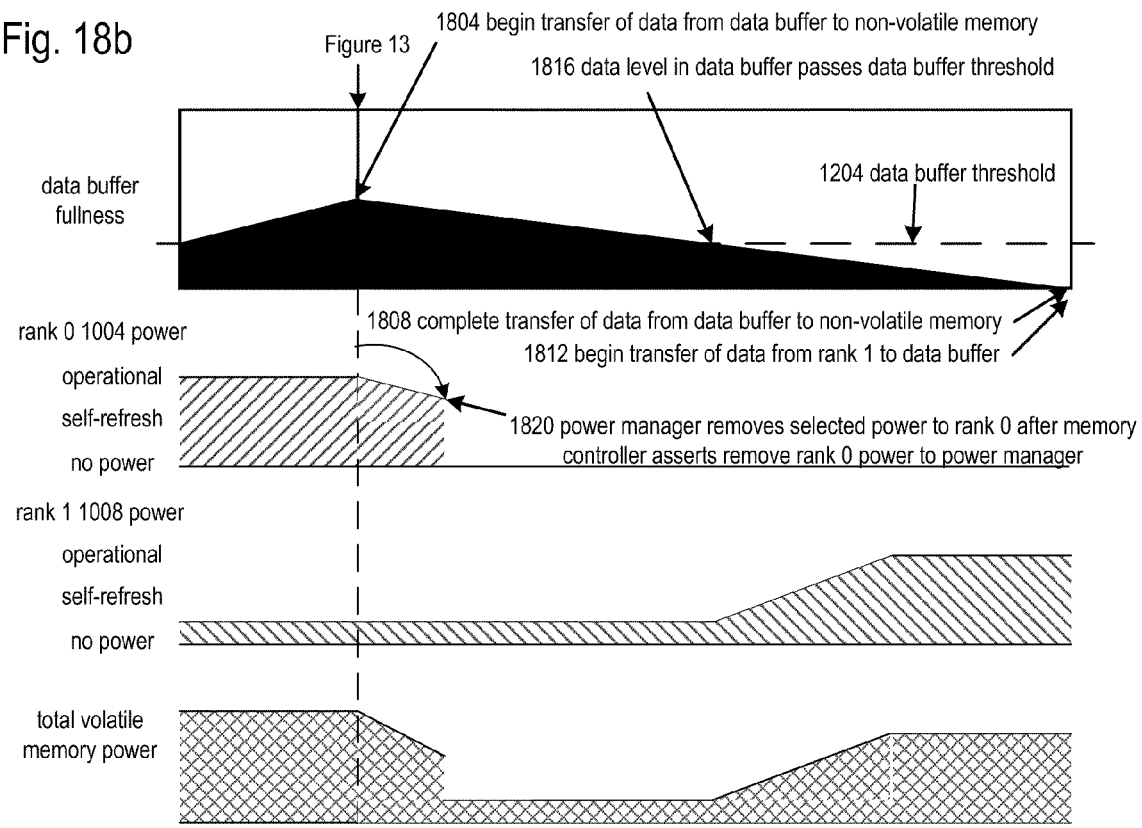

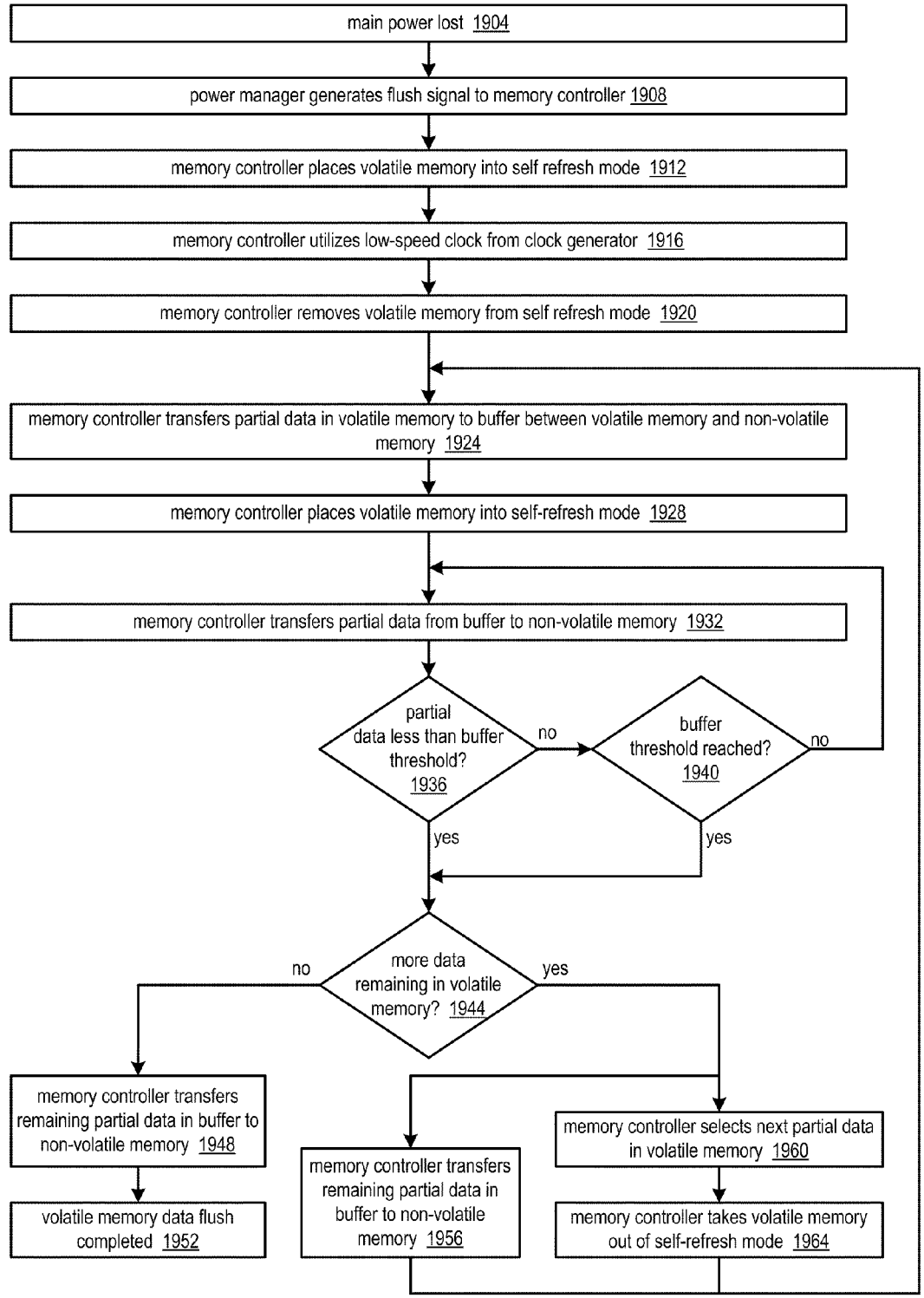
Fig. 19    flush process for single-rank volatile memory with thresholds Fig. 20a    flush process for multiple-rank volatile memory with threshold
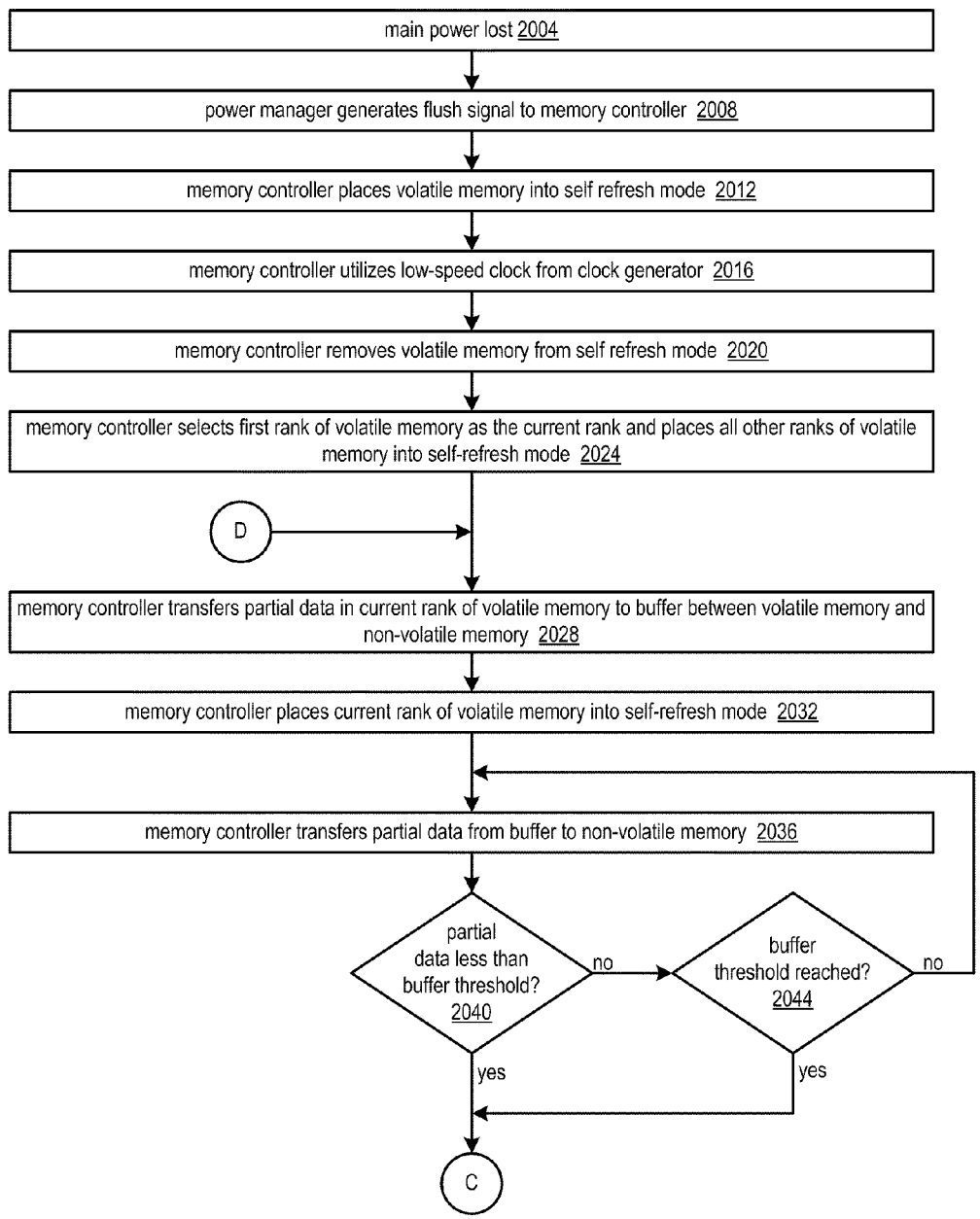

Fig. 20b  flush process for multiple-rank volatile memory with threshold (continued)
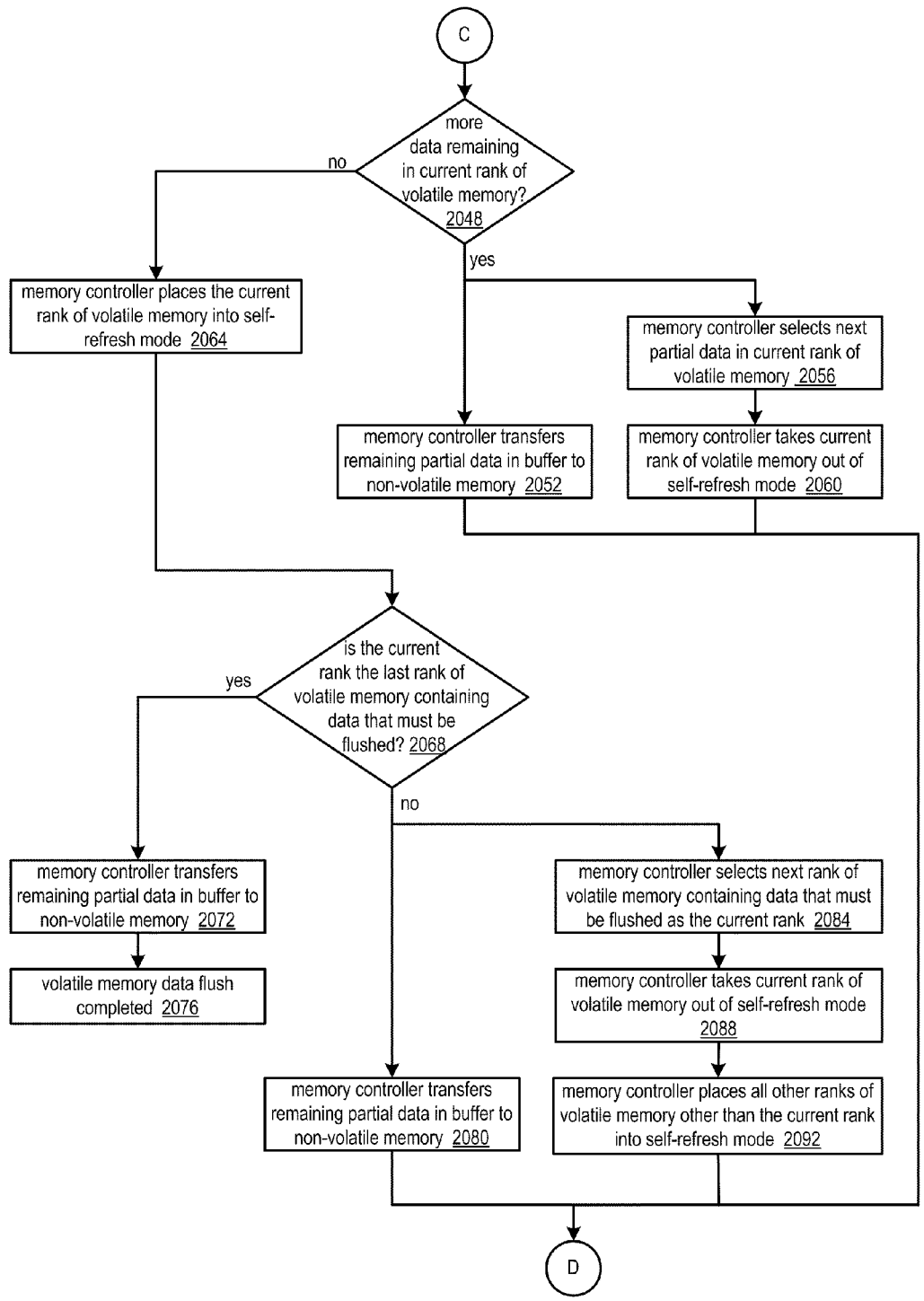

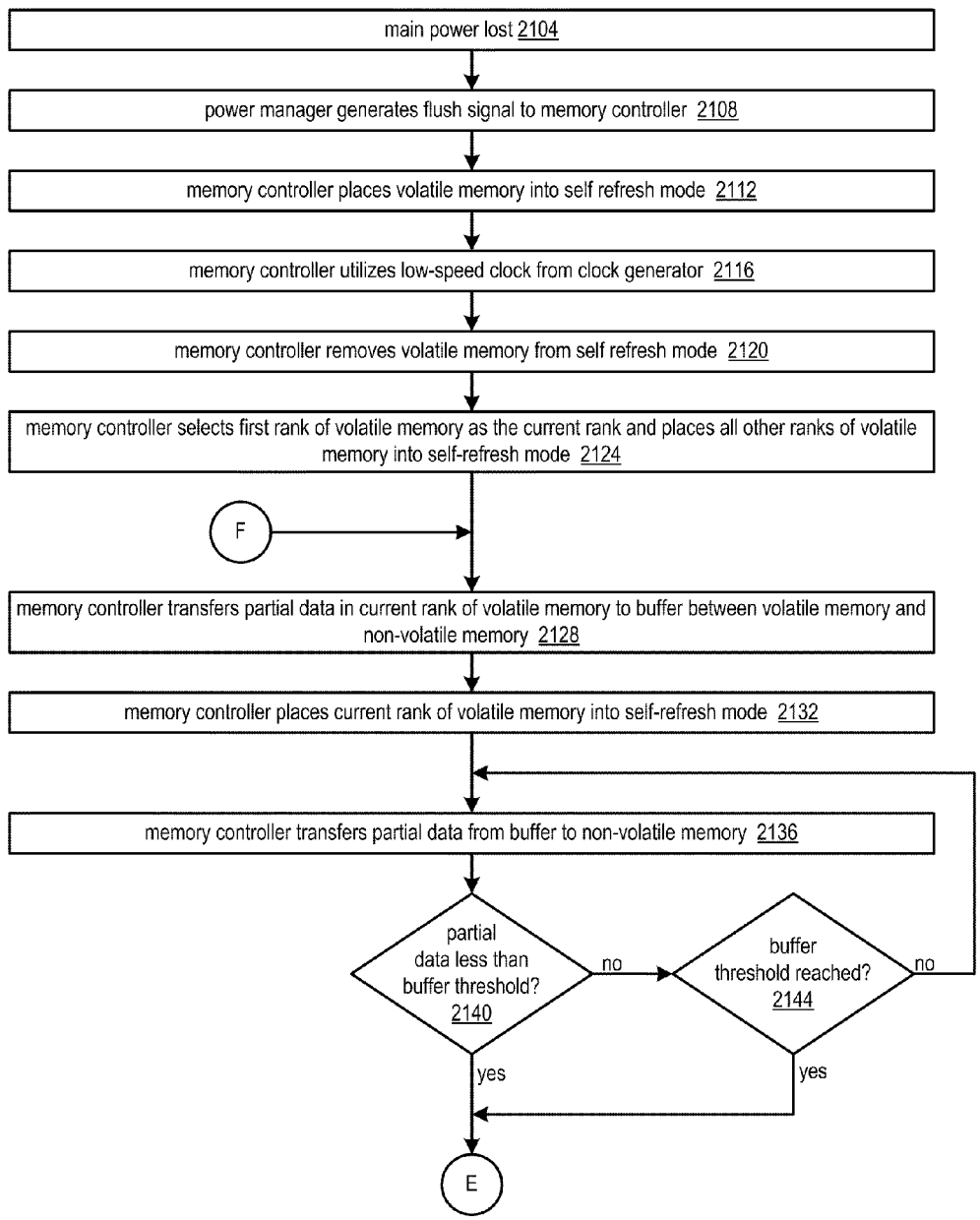
Fig. 21a    flush process for multiple-rank volatile memory with threshold

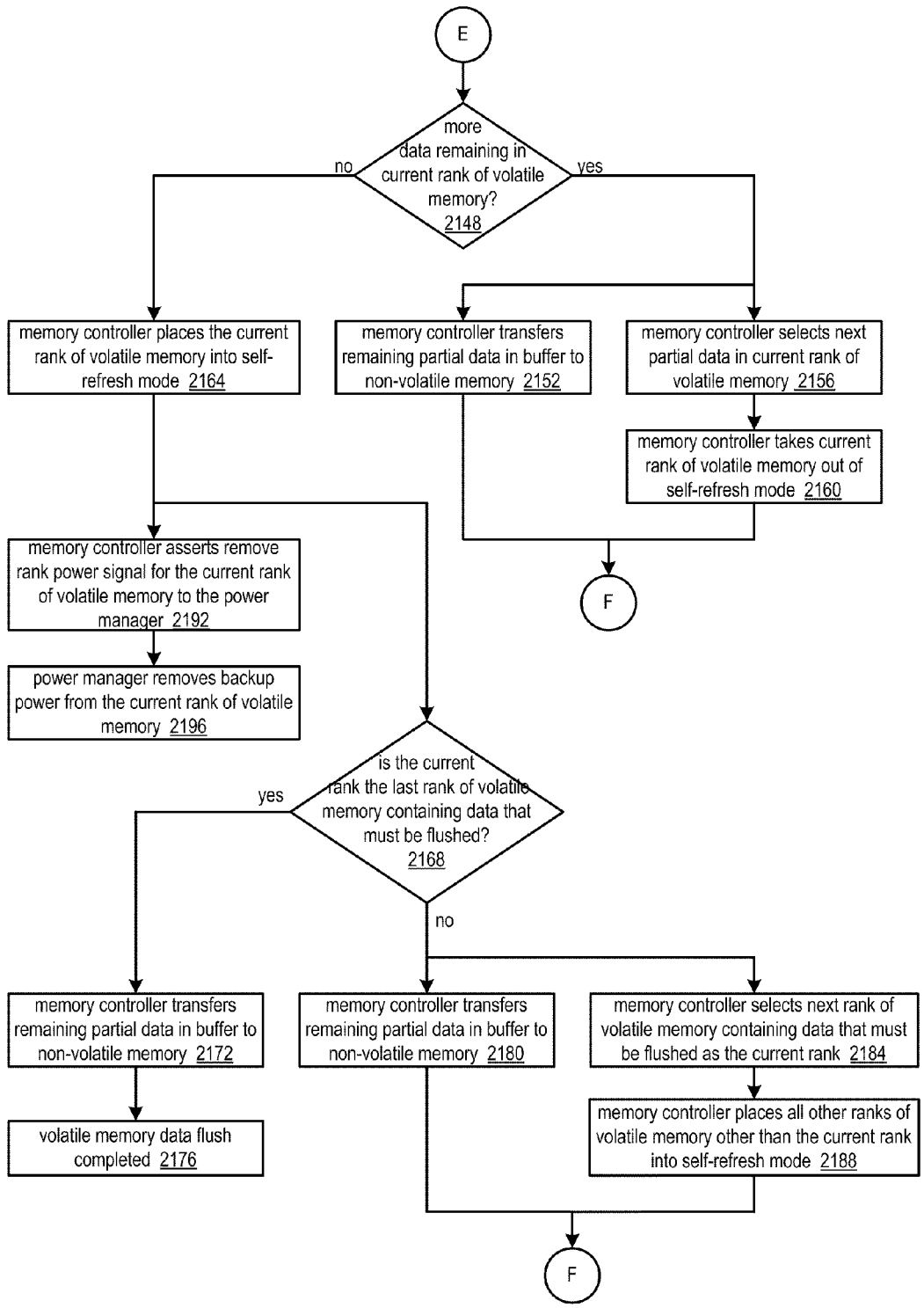
Fig. 21b  flush process for multiple-rank volatile memory with threshold (continued)

BUFFER MANAGEMENT METHOD AND APPARATUS FOR POWER REDUCTION DURING FLUSH OPERATION

CROSS REFERENCE TO RELATED APPLICATION(S)

This application claims the benefit of pending U.S. Provisional Application Ser. No. 61/318,759 filed Mar. 29, 2010, entitled METHOD AND APPARATUS FOR POWER REDUCTION DURING FLUSH OPERATION, which is hereby incorporated by reference for all purposes and which were owned or subject to an obligation of assignment to Dot Hill Systems Corporation at the time the invention claimed herein was made. This application is related to pending non-Provisional U.S. application Ser. No. 13/012,299 (filed Jan. 24, 2011, entitled MEMORY CALIBRATION METHOD AND APPARATUS FOR POWER REDUCTION DURING FLUSH OPERATIONS inventors Rex Weldon Vedder, Michael Joseph Peters, and Bradford Edwin Golson).

FIELD

The present invention is directed to computer data storage. In particular, the present invention is directed to methods and apparatuses for reducing power consumption in memory subsystems when flushing data from volatile memory following main power loss.

BACKGROUND

Computing systems often utilize processors, volatile memory, and non-volatile memory. The volatile memory provides temporary storage of instructions and data, while the non-volatile memory provides longer term, and sometimes permanent, storage. Volatile memory often provides temporary data storage for data read from, or written to, data storage devices. In many computing systems, the data storage devices are hard disk drives, solid state disks (SSDs), tape drives, or optical drives. In some cases, the data storage devices are organized into partitions and logical volumes, and can be accessed using Redundant Array of inexpensive disks (RAID) techniques.

In many computing systems, portions of the volatile memory are organized as caches. When a read cache is provided, the computing system stores frequently accessed read data in the cache memory so it can be read by a processor in much less time than reading from one or more storage devices. When a write cache is provided, the computing system stores new write data in the write cache. Once enough data to write one or more pages or stripes is present in the write cache, the computing system writes an entire page or stripe at the same time to the storage devices.

Computing systems often need to protect the write cache contents of a volatile memory, since the write data present is often a posted write. In a posted write, a host or other computer writes data to the computing system to store the data on one or more storage devices. The computing system temporarily stores the posted write data in the volatile memory, and sends a notification to the host or other computer that the posted write data has been written to the storage devices. From that point on, the writing application or operating system in the host or other computer assumes the posted write data has been successfully stored. However, in reality the posted write data in the computing system has not been stored to storage devices just yet.

A potential problem arises if main power to the computing system is lost between the time the computing system provides the notification to the host or other computer that the data has been written to the storage devices, and the time that all of the posted write data is finally written to the storage devices. Volatile memory devices do not retain memory contents if power to the volatile memory devices is lost. Therefore, if all of the writes described above are not properly completed by the time power is lost, at least some posted write data will be lost. This may result in an application crash, incorrect data stored, or other problems that must be avoided. System designers have long recognized this problem, and as a result have integrated backup power systems with the computing system. The backup power system generally provides a self-contained power source and associated circuitry that detects a main power failure, transfers posted write (and other important write data and parameters) from the volatile memory to a non-volatile memory. The non-volatile memory is usually, but not necessarily, a part of the computing system, and retains data contents whether or not power is present. When main power returns, the power circuitry detects this, transfers the posted write data from non-volatile memory to the volatile memory, and finally writes the posted write data from the volatile memory to the originally intended storage devices.

The backup power source must therefore have sufficient capacity to provide power to the volatile memory, the non-volatile memory, and any circuitry that saves (flushes) all of the posted write data to the non-volatile memory, in the absence of main power. Once all of the posted write data has been successfully flushed to the non-volatile memory, it is often acceptable for the backup power source to have minimal or no further energy capacity.

SUMMARY

The present invention is directed to solving disadvantages of the prior art. In accordance with embodiments of the present invention, a method for providing reduced power consumption in a computer memory system is provided. The method includes transferring, by a memory controller coupled to a volatile memory, a non-volatile memory, and a buffer, first data from the volatile memory to the buffer. The buffer stores less data than the volatile memory and the non-volatile memory, and the memory controller controls data transfers between the volatile memory, the buffer, and the non-volatile memory. The method further includes placing, by the memory controller, the volatile memory into self-refresh mode after transferring the first data to the buffer. The method includes conveying, by the memory controller, the first data from the buffer to the non-volatile memory, where the amount of first data in the buffer exceeds a predetermined threshold. While conveying the first data from the buffer to the non-volatile memory, the memory controller takes the volatile memory out of self-refresh mode when the amount of first data remaining in the buffer reaches the predetermined threshold. The volatile memory is ready to transfer second data to the buffer when the memory controller is finished transferring the first data from the buffer to the non-volatile memory.

In accordance with another embodiment of the present invention, a computer memory system that flushes data from a volatile memory to a non-volatile memory when main power is lost to the computer memory system is provided. The computer memory system includes a volatile memory, where the volatile memory is in self-refresh mode. The computer memory system includes a buffer, including first data, where the amount of first data in the buffer exceeds a predetermined threshold. The buffer stores less data than the volatile memory and the non-volatile memory. The computer memory system also includes a non-volatile memory and a memory controller, coupled to the volatile memory, the buffer, and the non-volatile memory. The memory controller controls data transfers between the volatile memory, the buffer, and the non-volatile memory, and transfers the first data from the volatile memory to the buffer prior to placing the volatile memory in self-refresh mode. During a transfer of first data from the buffer to the non-volatile memory, when the amount of first data remaining in the buffer reaches the predetermined threshold, the memory controller takes the volatile memory out of self-refresh mode. The volatile memory is ready to transfer second data to the buffer when the memory controller is finished transferring the first data from the buffer to the non-volatile memory.

An advantage of the present invention is it reduces backup power source drain during cache flush operations. By maximizing the time during a flush operation that the volatile memory is in self-refresh mode, backup power drain is reduced compared to keeping the volatile memory active during the flush operation.

Another advantage of the present invention is it increases flush operation efficiency and speed by bringing the volatile memory (or the active bank of volatile memory) out of self-refresh mode concurrently with transferring a predetermined amount of flush data from a buffer to a non-volatile memory. Buffer utilization is maximized and waiting is minimized.

Additional features and advantages of embodiments of the present invention will become more readily apparent from the following description, particularly when taken together with the accompanying drawings.

BRIEF DESCRIPTION OF THE DRAWINGS

FIG. 5 is a block diagram illustrating a timing delay parameter table in accordance with the preferred embodiment of the present invention.

FIG. 6 is a flowchart illustrating a method for calibrating volatile memory in accordance with the preferred embodiment of the present invention.

FIG. 8 is a flowchart illustrating a method for performing a volatile memory flush process in accordance with a first embodiment of the present invention.

FIG. 9a is a flowchart illustrating a first portion of a method for performing a volatile memory flush process in accordance with a second embodiment of the present invention.

FIG. 9b is a flowchart illustrating a second portion of a method for performing a volatile memory flush process in accordance with a second embodiment of the present invention.

FIG. 16a is a block diagram illustrating a volatile memory power profile during transition between volatile memory banks according to a first condition of a second embodiment of the present invention.

FIG. 16b is a block diagram illustrating a volatile memory power profile during transition between volatile memory banks according to a second condition of the second embodiment of the present invention.

FIG. 17a, a block diagram illustrating a volatile memory power profile during transition between volatile memory banks according to a first condition of a third embodiment of the present invention.

FIG. 17b, a block diagram illustrating a volatile memory power profile during transition between volatile memory banks according to a second condition of a third embodiment of the present invention.

FIG. 18a, a block diagram illustrating a volatile memory power profile during transition between volatile memory banks according to a first condition of a fourth embodiment of the present invention.

FIG. 18b, a block diagram illustrating a volatile memory power profile during transition between volatile memory banks according to a second condition of a fourth embodiment of the present invention.

FIG. 19 is a flowchart illustrating a single bank volatile memory flush operation using a buffer threshold in accordance with an embodiment of the present invention.

FIG. 20a is a flowchart illustrating a first part of a first multiple bank volatile memory flush operation embodiment using a buffer threshold in accordance with the present invention.

FIG. 20b is a flowchart illustrating a second part of a first multiple bank volatile memory flush operation embodiment using a buffer threshold in accordance with the present invention.

FIG. 21a is a flowchart illustrating a first part of a second multiple bank volatile memory flush operation embodiment using a buffer threshold in accordance with the present invention.

FIG. 21b is a flowchart illustrating a second part of a second multiple bank volatile memory flush operation embodiment using a buffer threshold in accordance with the present invention.

DETAILED DESCRIPTION

The present invention is directed to the problem of reducing power during volatile memory flush operations. Although flush operations are required in order to save posted write data in volatile memories when main power is lost, any data contents that need to be preserved following power loss are involved in a flush operation. Write cache data, configuration data, metadata, encryption keys, or any other data that needs to be saved can be flushed from a volatile memory to a non-volatile memory.

Figure 1:
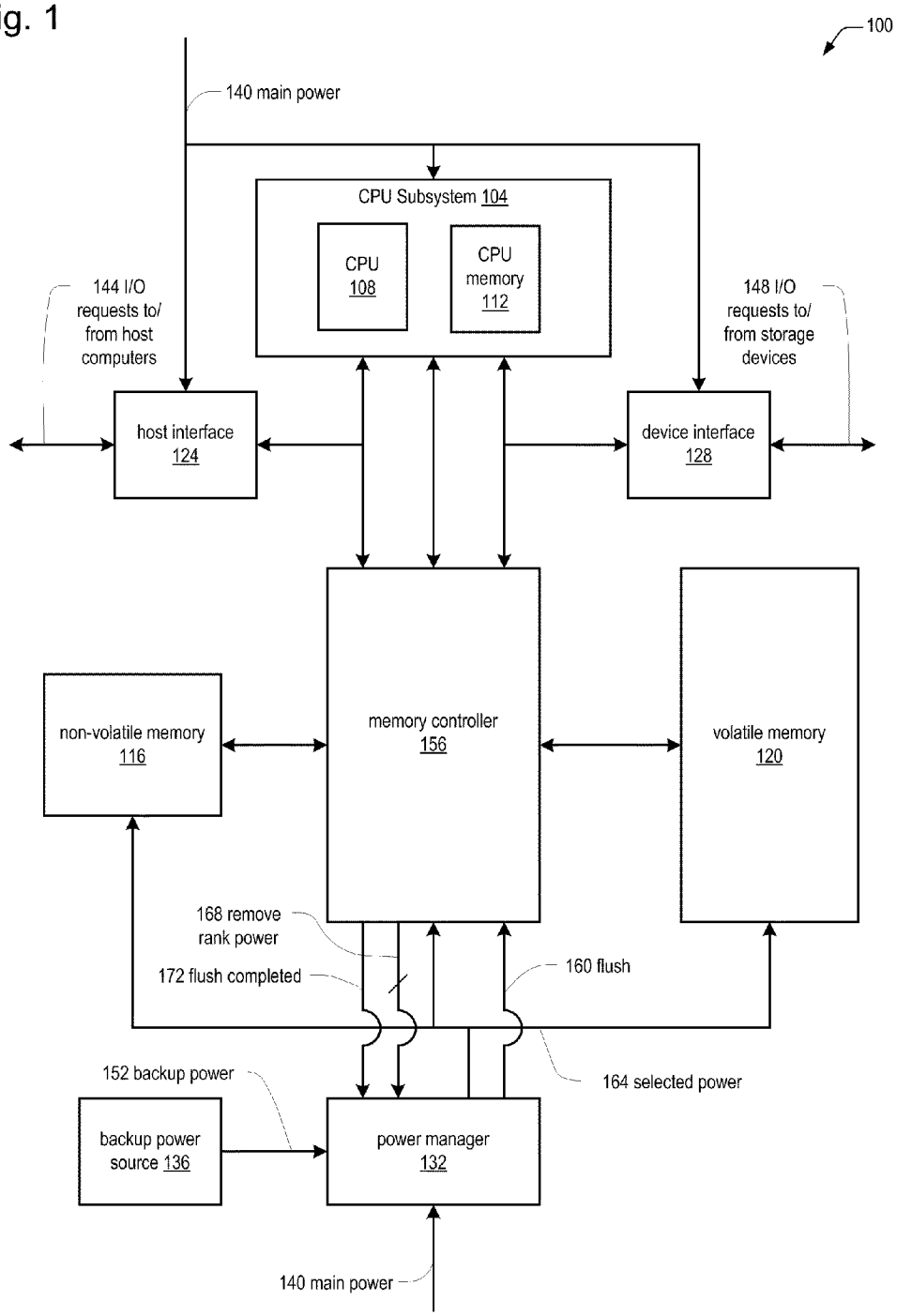
FIG. 1 is a block diagram illustrating components of a computing system in accordance with embodiments of the present invention.

Referring now to FIG. 1, a block diagram illustrating components of a computing system 100 in accordance with embodiments of the present invention is shown. Computing system 100 is any data processing system or computer that includes a volatile memory 120 and performs flush operations on data stored in the volatile memory 120 when main power 140 is lost. In a preferred embodiment, computing system 100 is an intelligent storage controller that communicates with host computers and storage devices.

Computing system 100 includes a CPU subsystem 104, which includes a CPU or processor 108 and CPU memory 112. CPU 108 is a device that executes stored programs, and may be a microprocessor, microcontroller, embedded processor, RISC processor, or field programmable gate array (FPGA). In one embodiment, CPU 108 is a mobile Pentium processor made by Intel. CPU memory 112 includes either volatile memory, non-volatile memory, or both. Volatile memory may be any type of dynamic RAM, including DDR RAM and SDRAM. Non-volatile memory includes EEPROM, compact flash, PRam, RRam, NRam, CBRam, and any type of computer memory that retains data contents in the absence of power.

CPU subsystem 104 communicates with host interface 124, which receives I/O requests from host computers 144, and provides data to host computers 144. In one embodiment, host interface 124 is an LSI Logic SAS2008 SAS controller device. CPU subsystem 104 also communicates with device interface 128, which generates I/O requests to storage devices 148, and receives data from storage devices 148. In one embodiment, device interface 128 is an LSI Logic SAS2008 SAS controller device coupled to a PMC PM8005 SAS Expander device. Storage devices include any mass storage devices that provide non-volatile storage for large amounts of data. Storage devices include hard disk drives, solid state drives, tape drives, and optical drives. In some embodiments, storage devices are organized into logical groupings and accessed using redundant array of inexpensive disks (RAID) technology. In some embodiments, host interface 124, CPU subsystem 104, and device interface 128 are powered only with main power 140. Therefore, those devices will only continue to operate if a main power 140 is present. This means that host interface 124, CPU subsystem 104, and device interface 128 are not involved in any flush operations as further described.

Computing system 100 also includes a memory controller 156. Memory controller 156 controls volatile memory 120 and non-volatile memory 116, and all data transfers between volatile memory 120 and non-volatile memory 116. In one embodiment, memory controller 156 is included within a "North Bridge" device in a personal computer, server, or mobile computer chipset. In a preferred embodiment, memory controller 156 is implemented in a custom FPGA such as a Xilinx Virtex V family component.

Volatile memory 120 is the main volatile memory store in computing system 100. In the context of the present invention, volatile memory 120 supports a low-power "self-refresh" mode. The memory controller 156 places the volatile memory 120 into self-refresh mode, and takes volatile memory 120 out of self-refresh mode. If the volatile memory 120 is in self-refresh mode, the memory controller 156 must take the volatile memory 120 out of self-refresh mode as part of preparing the volatile memory 120 to be accessed. In some embodiments, volatile memory 120 is organized into ranks, which may be modular or non-modular in organization. Ranks are capable of independent read, write, and self-refresh from other ranks, and are generally organized according to the word size (width) of volatile memory. One embodiment of a modular organization is a dual-inline memory module (DIMM) organization, where a group of similar capacity volatile memory devices are organized in a parallel fashion and are capable of field upgrade and replacement. In a preferred embodiment, volatile memory 120 includes areas designated as a write cache and a read cache. The write cache area stores posted write data, which is saved to the non-volatile memory 116 in the event of main power 140 loss.

Non-volatile memory 116 is the main non-volatile memory store in computing system 100. Although non-volatile memory 116 is most commonly a form of semiconductor memory as described earlier with respect to CPU memory 112, in some embodiments non-volatile memory 116 is one or more hard disk drives or solid state disks. Non-volatile memory 116 provides permanent storage for computer programs executed by CPU 108, but in a preferred embodiment provides at least as much available unused space as required to store all flush data transferred from volatile memory 120 to non-volatile memory 116. In some embodiments, non-volatile memory 116 is physically removable from computing system 100. Non-volatile memory 116 supports significantly lower data transfer rates than volatile memory 120. For example, in one embodiment, non-volatile memory 116 is compact flash supporting a maximum data transfer rate of 80 megabytes per second (MB/s), and volatile memory 120 is DDR2 memory supporting a minimum transfer rate of 2,000 MB/s.

Computing system 100 includes a backup power source 136, which provides backup power 152 to a power manager 132. Backup power source 136 is a self-contained power source that provides a limited amount of operating power to components of computing system 100. In a preferred embodiment, backup power source 136 includes a supercapacitor device. In other embodiments, backup power source 136 may be one or more batteries or gold capacitors. Batteries used in backup power source 136 may be either rechargeable or non-rechargeable. Rechargeable batteries include Lithium Ion or Nickel metal hydride technologies. Non-rechargeable batteries include alkaline battery technologies. Backup power source 136 may be either permanently attached to computing system 100, or factory or field replaceable.

Power manager 132 receives both main power 140 and backup power 152, and provides selected power 164 to the non-volatile memory 116, memory controller 156, and volatile memory 120. Selected power 164 is main power 140 when main power 140 is present, and selected power 164 is backup power 152 when main power 140 is not present, provided that backup power 152 is available. Power manager 132 detects loss of main power 140, and generates a flush signal 160 to the memory controller 156 in response. After receiving the flush signal 160, memory controller 156 prepares to initiate a flush operation from volatile memory 120 to the non-volatile memory 116. When the flush operation is completed, memory controller 156 asserts flush completed 172 to the power manager 132.

In some embodiments, power manager 132 discontinues supplying backup power 152 to non-volatile memory 116, memory controller 156, and volatile memory 120, in response to receiving a flush completed 172 indication from memory controller 156. In other embodiments, power manager 132 discontinues supplying backup power 152 to non-volatile memory 116, memory controller 156, and volatile memory 120, in response to completing transferring all flush data from the volatile memory 120 to the non-volatile memory 116. In some embodiments, power is not turned off after a flush operation is completed, but the volatile memory 120 is left powered until backup power 152 is exhausted.

Volatile memory 120 includes one or more ranks of volatile memory 120, such as when volatile memory 120 is implemented with two or more dual inline memory modules (DIMMs). In some embodiments, when all flush data is transferred out of a first rank of volatile memory 120, memory controller 156 generates a remove rank power 168 signal to the power manager 132. There are as many remove rank power 168 signals as ranks of volatile memory 120. In response, power manager 132 removes selected power 164 to (only) the current rank of volatile memory 120, while continuing to provide selected power 164 to all other ranks of volatile memory 120 still containing unflushed data. This preserves the backup power source 136 in case more backup power 152 is required, such as if backup power source 136 is a non-rechargeable power source.

Figure 2:
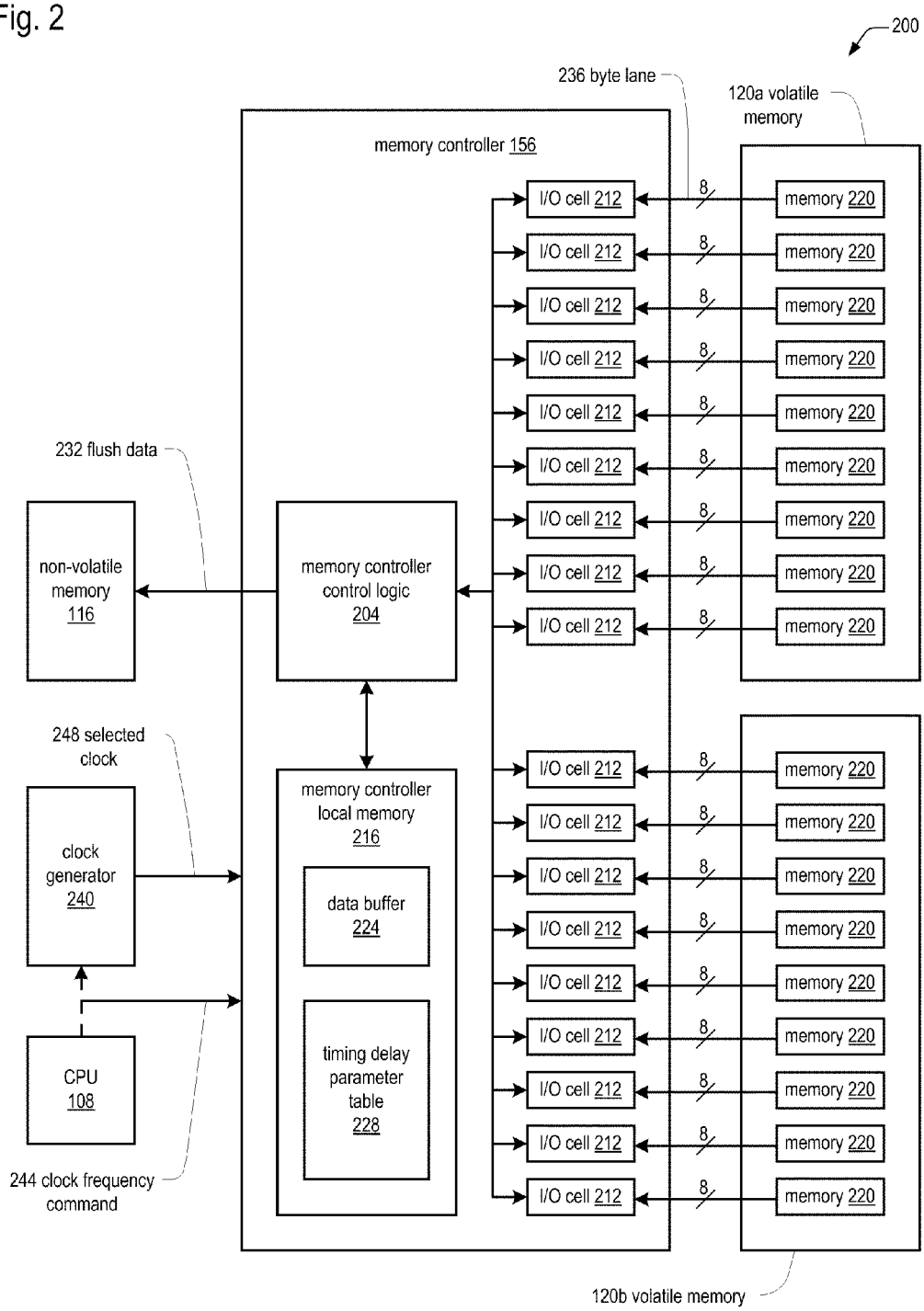
FIG. 2 is a block diagram illustrating details of a memory controller and volatile memory of the computer memory system in accordance with embodiments of the present invention.

Referring now to FIG. 2, a block diagram 200 illustrating details of a memory controller 156 and volatile memory 120 of the computer memory system 100 in accordance with embodiments of the present invention is shown. As described previously with respect to FIG. 1, volatile memory 120 may be organized as multiple ranks of memory. In a preferred embodiment, volatile memory 120 includes volatile memory modules 120a and 120b. Each of volatile memory modules 120a and 120b includes a parallel organization of memory devices 220. In a preferred embodiment, each volatile memory module 120a, 120b includes eight byte-wide memory devices 220 for storing data and one byte-wide memory device 220 for storing ECC. Therefore, there is a 72-bit wide interface to each volatile memory module 120a, 120b, where 72-bit wide interfaces include nine byte lanes 236. In other embodiments, memory devices 220 may be bit-wide devices or wider devices up to the full width of the memory rank including 16, 32, 64, or more bits wide. Therefore, byte lanes 236 (or data lanes) represents any such memory organization, and I/O cells 212 reflect the corresponding adjustment granularity, from individual bits to many bytes wide. Although byte lanes 236 are shown unidirectionally as transferring data from memory devices 220 to I/O cells 212 (as in a flush operation), it should be generally understood that each byte lane 236 is truly bidirectional and may transfer data in either direction.

Memory controller 156 includes a unique I/O cell 212 corresponding to each byte lane 236 to volatile memory modules 120a, 120b. I/O cells 212 are described in more detail in FIG. 3.

Memory controller 156 includes memory controller control logic 204, which controls the operation of memory controller 156 and provides interfaces to non-volatile memory 116 and a memory controller local memory 216. Although flush data 232 is shown unidirectionally as transferring data from memory controller 156 to non-volatile memory 116 (as in a flush operation), it should be generally understood that flush data path 232 is truly bidirectional and may transfer data in either direction.

In a preferred embodiment, memory controller local memory 216 includes a data buffer 224 and a timing delay parameter table 228. In other embodiments, data buffer 224 and timing delay parameter table 228 may be external to memory controller 156, but accessible by memory controller 156. Data buffer 224 provides temporary storage for a portion of the flush data as it is flushed from the volatile memory 120 to the non-volatile memory 116. In a preferred embodiment, data buffer 224 is a dual-ported memory. The data buffer 224 may possibly, but not necessarily, provide temporary storage for flush data as it is transferred from the non-volatile memory 116 to the volatile memory 120 after main power 140 is restored. In a preferred embodiment, data may be transferred from the volatile memory 120 to the data buffer 224 concurrently with transferring data from the data buffer 224 to the non-volatile memory 116. The data buffer 224 stores less data than either the volatile memory 120 or the non-volatile memory 116, in order to minimize costs. The timing delay parameter table 228 is described in more detail with respect to FIG. 5.

Computing system 100 includes a clock generator 240, which in one embodiment programmatically generates a selected clock 248 to the memory controller 156 under control of CPU 108. CPU 108 generates clock frequency command 244 to the clock generator 240 to cause clock generator 240 to generate a selected clock 248 to the memory controller 156 corresponding to the clock frequency command 244. Alternatively, clock generator 240 provides several clocks 248 to memory controller 156, and CPU 108 provides an indication to memory controller 156 to select a specific clock 248. In a preferred embodiment, CPU 108 generates a low-speed clock frequency command 244 and a high-speed clock frequency command 244 directly to the memory controller 156. Memory controller 156 is also able to select a specific clock 248 based on the state of flush 160 from the power manager 132. In other embodiments, the clock generator 240 is within the memory controller 156, and may be controlled by a processor or control logic 204 within the memory controller 156.

Figure 3:
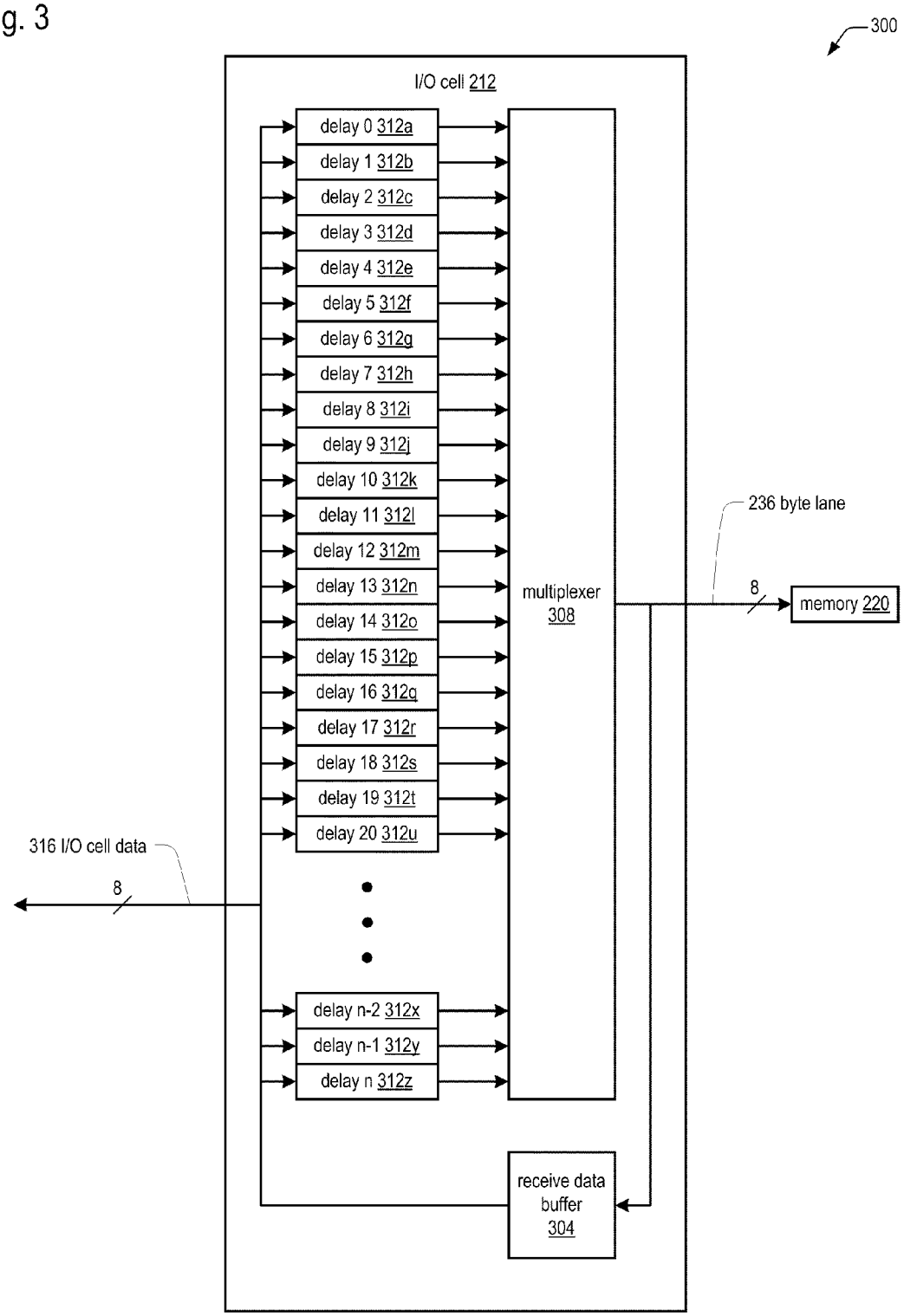
FIG. 3 is a block diagram illustrating details of an I/O cell within a memory controller of the computer memory system in accordance with embodiments of the present invention.

Referring now to FIG. 3, a block diagram 300 illustrating details of an I/O cell 212 within a memory controller 156 of the computer memory system 200 in accordance with embodiments of the present invention is shown. I/O cell 212 provides a byte-wide interface to the memory controller control logic 204, using I/O cell data 316. As discussed previously with respect to FIG. 2, each I/O cell 212 communicates with a memory device 220 in a volatile memory module 120a, 120b over a byte lane 236.

In one embodiment, I/O cells 212 have a number of delay taps 312 that are selectable to provide unique timing to memory devices 220. FIG. 3 illustrates n delay taps 312 in I/O cell 212, ranging from a first delay tap 0 312a through a last delay tap n 312z. In a preferred embodiment, there are 64 delay taps 312 per I/O cell 212. In other embodiments, there are 8, 16, or 128 delay taps 312. However, any number of delay taps 312 may be provided, depending on design complexity and timing granularity desired between adjacent delay taps 312.

In one embodiment, I/O cell 212 has a multiplexer 308, which selects one of all provided delay taps 312 to provide I/O cell 212 timing for writes to memory device 220. FIG. 6 illustrates the process to select a specific delay tap 312 for each I/O cell 212. In other embodiments, I/O cells 212 do not have a multiplexer 308, and instead provides registers to specify the amount of programmable delay from a single delay tap 312.

Finally, each I/O cell 212 has a receive data buffer 304, that provides temporary storage of read data from a memory device 220. Receive data buffer 304 drives I/O cell data 316 elsewhere within memory controller 156 using I/O cell data 316.

Figure 4:
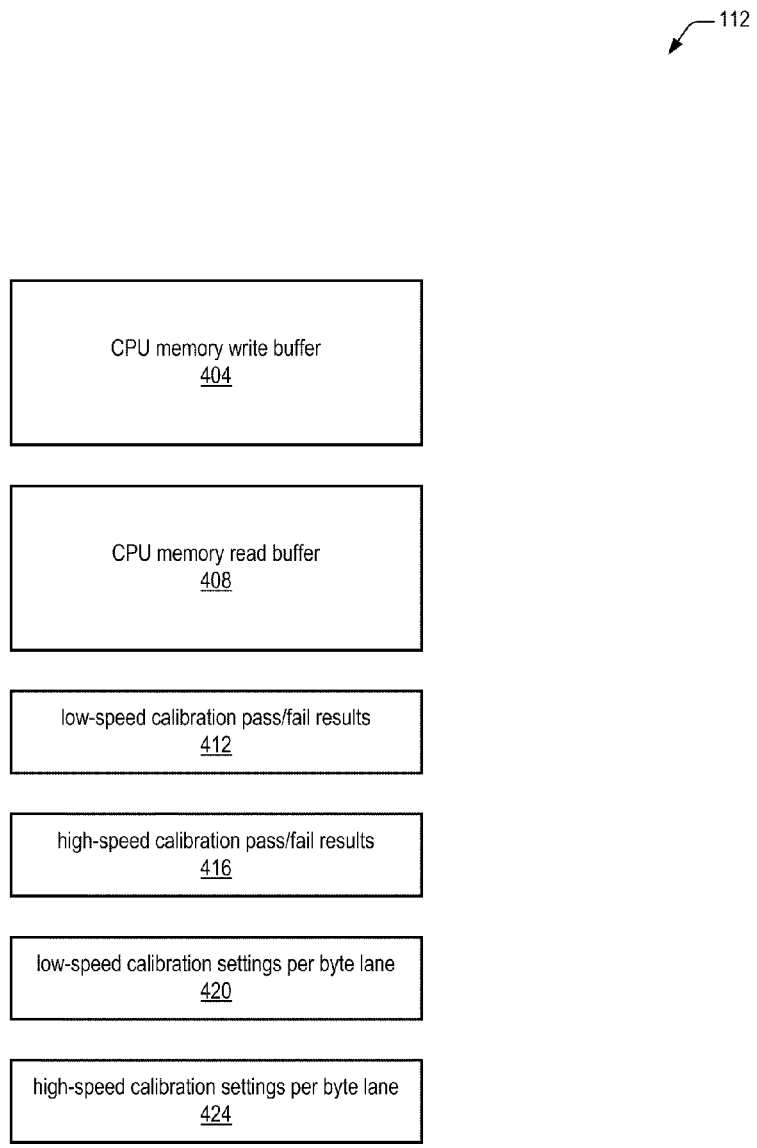
FIG. 4 is a block diagram illustrating a read buffer, a write buffer, and parameters stored in a CPU memory of the computer memory system in accordance with the preferred embodiment of the present invention.

Referring now to FIG. 4, a block diagram illustrating a read buffer 408, a write buffer 404, and parameters stored in a CPU memory 112 of the computer memory system 100 in accordance with the preferred embodiment of the present invention is shown. In the preferred embodiment of the present invention, the CPU 108 performs calibration of the volatile memory 120 with the memory controller 156. However, there is no reason why such functionality could not be included within memory controller 156 in other embodiments—whereupon power-up, the memory controller 156 automatically calibrates all volatile memory devices 220 at all desired operating speeds. In these other embodiments, the various buffers and parameters shown in FIG. 4 could be fully provided within memory controller local memory 216. Instead of CPU 108 dealing with these buffers and parameters directly, a separate processor or CPU within memory controller 156 could interact with the parameters and provide local memory calibration.

In the preferred embodiment, CPU memory 112 includes a CPU memory write buffer 404 and a CPU memory read buffer 408. The CPU 108 stores a predetermined data pattern in the CPU memory write buffer 404. The memory controller 156 writes the predetermined data pattern to the volatile memory 120, using a specific delay tap 312 setting. The memory controller 156 then reads the data from the volatile memory 120 from the same addresses written to, and places the data into the CPU memory read buffer 408. The CPU memory write buffer 404 and CPU memory read buffer 408 are used in conjunction with the calibration process of FIG. 6.

After the CPU 108 compares the predetermined data in the CPU memory write buffer 404 with the data in the CPU memory read buffer 408, CPU 108 stores pass/fail results for each byte lane 236. Low speed calibration pass/fail results 412 are stored for each byte lane 236, and correspond to calibration using a low speed selected clock 248. High speed calibration pass/fail results 416 are stored for each byte lane 236, and correspond to calibration using a high speed selected clock 248. In the preferred embodiment, low speed calibration pass/fail results 412 and high speed calibration pass/fail results 416 are stored for each byte lane 236. However, in other embodiments, only low speed calibration pass/fail results 412 are stored, or else additionally one or more sets of intermediate "medium speed" calibration pass/fail results are stored. However, more results will take longer to obtain and more memory space is required for storage.

Each of low-speed/high-speed calibration pass/fail results 412, 416 are obtained for every delay tap 312 for all byte lanes 236. For example, in a system where each I/O cell 212 has 64 delay taps 312 and there are 18 volatile memory byte lanes 236, there are 64×18=1152 pass/fail results for each of low-speed calibration pass/fail results 412 and high-speed calibration pass/fail results 416.

CPU memory 112 also includes low-speed calibration settings per byte lane 420 and high-speed calibration settings per byte lane 424. These are obtained by the CPU 108 reviewing the low-speed calibration pass/fail results 412 and high-speed calibration pass/fail results 416 in order to determine the optimal delay tap 312 selection for each I/O cell 212 in the memory controller 156. The process of identifying optimal delay tap 312 selections is illustrated in FIG. 6.

Referring now to FIG. 5, a block diagram illustrating a timing delay parameter table 228 in accordance with the preferred embodiment of the present invention is shown. Although in the preferred embodiment, the timing delay parameter table 228 is within the memory controller local memory 216, in other embodiments it could be stored in another volatile memory of the computing system 100, including CPU memory 112.

FIG. 5 illustrates a simplified table for easy illustration, where there are a total of 14 delay taps 312 and 8 byte lanes 236. Each intersection of a delay tap 312 and byte lane 236 includes a pass/fail result for that specific combination. Therefore, FIG. 5 represents the pass/fail results for either low-speed calibration or high-speed calibration after all measurements have been taken. For a computing system 100 that performs both low-speed and high-speed volatile memory 120 calibration, there would be two such tables similar to FIG. 5.

Referring to byte lane 0, there are a series of consecutive pass results from delay tap 1 through delay tap 7. In the process of FIG. 6, the CPU 108 selects the optimal delay tap 312 within the longest string of consecutive "pass" results. In the preferred embodiment, the optimal delay tap 312 is the centermost delay tap. Therefore, the CPU 108 selects delay tap 4 as the optimal delay tap 312 for byte lane 0 (at whatever low speed or high speed clock 248 is selected). The optimal delay tap 312 is denoted by the bold box outlines in FIG. 5. The centermost "pass" result is chosen for the selected delay tap 312 since it is the most likely selection to continue to work reliably across variations of temperature and voltage. However, in other embodiments, a different delay tap than the centermost delay tap may be the optimal delay tap 312.

Referring to byte lane 1, there are a series of consecutive pass results from delay tap 3 through delay tap 6. In the process of FIG. 6, the CPU 108 selects the centermost delay tap within the longest string of consecutive "pass" results. Therefore, the CPU 108 selects delay tap 4 as the optimal delay tap 312 for byte lane 1 (at whatever low speed or high speed clock 248 is selected).

Referring to byte lane 2, there are a series of consecutive pass results from delay tap 4 through delay tap 10. In the process of FIG. 6, the CPU 108 selects the centermost delay tap within the longest string of consecutive "pass" results. Therefore, the CPU 108 selects delay tap 7 as the optimal delay tap 312 for byte lane 2 (at whatever low speed or high speed clock 248 is selected).

Referring to byte lane 3, there are a series of consecutive pass results from delay tap 1 through delay tap 5. In the process of FIG. 6, the CPU 108 selects the centermost delay tap within the longest string of consecutive "pass" results. Therefore, the CPU 108 selects delay tap 3 as the optimal delay tap 312 for byte lane 3 (at whatever low speed or high speed clock 248 is selected).

Referring to byte lane 4, there are a series of consecutive pass results from delay tap 1 through delay tap 8. In the process of FIG. 6, the CPU 108 selects the centermost delay tap within the longest string of consecutive "pass" results. Therefore, the CPU 108 selects delay tap 5 as the optimal delay tap 312 for byte lane 4 (at whatever low speed or high speed clock 248 is selected).

Referring to byte lane 5, there are a series of consecutive pass results from delay tap 3 through delay tap 5. In the process of FIG. 6, the CPU 108 selects the centermost delay tap within the longest string of consecutive "pass" results. Therefore, the CPU 108 selects delay tap 4 as the optimal delay tap 312 for byte lane 5 (at whatever low speed or high speed clock 248 is selected).

Referring to byte lane 6, there are a series of consecutive pass results from delay tap 5 through delay tap 9. In the process of FIG. 6, the CPU 108 selects the centermost delay tap within the longest string of consecutive "pass" results. Therefore, the CPU 108 selects delay tap 7 as the optimal delay tap 312 for byte lane 6 (at whatever low speed or high speed clock 248 is selected).

Referring to byte lane 7, there are a series of consecutive pass results from delay tap 5 through delay tap 8. In the process of FIG. 6, the CPU 108 selects the centermost delay tap within the longest string of consecutive "pass" results. Therefore, the CPU 108 selects delay tap 6 as the optimal delay tap 312 for byte lane 7 (at whatever low speed or high speed clock 248 is selected).

There are some cases where either of a pair of adjacent delay taps 312 are "centermost" in a longest string of consecutive pass results. In one embodiment, the lower delay tap 312 is chosen. In a second embodiment, the longer delay tap 312 is chosen. In a third embodiment, the selected delay tap 312 of the pair is chosen randomly. In a fourth embodiment, the process alternates between selecting the lower and higher delay tap 312.

Referring now to FIG. 6, a flowchart illustrating a method for calibrating volatile memory 120 in accordance with the preferred embodiment of the present invention is shown. Flow begins at block 604.

At block 604, the memory controller 156 places volatile memory 120 into self-refresh mode. The volatile memory 120 must be in self-refresh mode while the memory controller 156 changes clock frequencies controlling volatile memory 120. Flow proceeds to block 608.

At block 608, the memory controller 156 utilizes a selected clock 248 from the clock generator 240. The selected clock 248 may correspond to low-speed operation, medium-speed operation, or high-speed operation of the memory controller 156. The process of FIG. 6 therefore is used for any memory controller 156 and volatile memory 120 calibration, and may be run multiple times to calibrate the volatile memory 120 to run reliably at multiple speeds. Flow proceeds to block 612.

At block 612, the memory controller 156 removes volatile memory 120 from self-refresh mode. Volatile memory 120 now operates at a speed corresponding to the selected clock 248. Flow proceeds to block 616.

At block 616, the CPU 108 loads a first delay tap 312 selection for all byte lanes 236 into the memory controller 156. In one embodiment, the first delay tap 312 selection provides minimal delay timing to the volatile memory 120. In a second embodiment, the first delay tap 312 selection provides maximum delay timing to the volatile memory 120. Flow proceeds to block 620.

At block 620, the CPU 108 loads a training pattern into a CPU memory write buffer 404. The training pattern is a predetermined data pattern to be used for volatile memory 120 reliability testing at various timings. Therefore, a sequence of binary '1's and '0' is preferably chosen with bit transitions known in the art to be useful for memory testing. Flow proceeds to block 624.

At block 624, the memory controller 156 writes the training pattern from the CPU memory write buffer 404 into a predetermined area of volatile memory 120, using selected timing from the selected delay tap 312 for all byte lanes 236. The selected timing is provided by the delay tap 312 selection made in block 616. The memory controller 156 may use direct memory access (DMA) techniques to read the training pattern from the CPU memory write buffer 404, and write the training pattern to the volatile memory 120. In an alternate embodiment, the CPU 108 writes the training pattern to locations in memory controller local memory 216, and the memory controller 156 writes the training pattern from the memory controller local memory 216 to the predetermined area of volatile memory 120. Flow proceeds to block 628.

At block 628, the memory controller 156 reads the contents of the predetermined area of volatile memory 120, and writes the contents of the predetermined area of volatile memory 120 into the CPU memory read buffer 408. In an alternate embodiment, the memory controller 156 reads the contents of the predetermined area of volatile memory 120 and stores the contents of the predetermined area of volatile memory 120 into the memory controller local memory 216, and the CPU 108 reads the contents of the predetermined area of volatile memory 120 from the memory controller local memory 216 and writes the contents of the predetermined area of volatile memory 120 into the CPU memory read buffer 408. Flow proceeds to block 632.

At block 632, the CPU 108 compares the CPU memory write buffer 404 contents with the CPU memory read buffer 408 contents, for each byte lane 236. In this way, the data integrity for each byte lane 236 is determined independently. Some data may compare for one byte lane 236 and some data may fail for a different byte lane 236. Flow proceeds to decision block 636.

At decision block 636, the CPU 108 determines if the CPU memory write buffer 404 contents are equal to the CPU memory read buffer 408 contents, for each byte lane 236. If the CPU memory write buffer 404 contents are equal to the CPU memory read buffer 408 contents, then flow proceeds to block 644. If the CPU memory write buffer 404 contents are not equal to the CPU memory read buffer 408 contents, then flow proceeds to block 640.

At block 640, the CPU 108 sets an indication in CPU memory 112 for each byte lane 236 at the selected delay tap 312 to reflect memory testing failure. If the current testing corresponds to low-speed volatile memory 120 testing, then the failure result is stored by the CPU 108 in low-speed calibration pass/fail results 412. If the current testing corresponds to high-speed volatile memory 120 testing, then the failure result is stored by the CPU 108 in high-speed calibration pass/fail results 416. If the current testing corresponds to intermediate-speed volatile memory 120 testing between low-speed testing and high-speed testing, then the failure result is stored by the CPU 108 in an intermediate-speed calibration pass/fail results portion of CPU memory 112 not shown in FIG. 4. In some embodiments, the low-speed pass/fail results 412 or high-speed pass/fail results 416 are not stored in CPU memory 112. In other words, it is only necessary to compare results on a byte lane 236 (or other supported granularity) basis, analyze the results, and write calibration settings 420, 424. The next byte lane results can overwrite the previous results while the calibration settings for the next byte lane 236 are being determined, and so on. In this way, the low-speed calibration pass/fail results 412 or high-speed calibration pass/fail results 416 may only store the results for the last byte lane 236 checked. Flow proceeds to decision block 648.

At block 644, the CPU 108 sets an indication in CPU memory 112 for each byte lane 236 at the selected delay tap 312 to reflect memory testing success. If the current testing corresponds to low-speed volatile memory 120 testing, then the success result is stored by the CPU 108 in low-speed calibration pass/fail results 412. If the current testing corresponds to high-speed volatile memory 120 testing, then the success result is stored by the CPU 108 in high-speed calibration pass/fail results 416. If the current testing corresponds to intermediate-speed volatile memory 120 testing between low-speed testing and high-speed testing, then the success result is stored by the CPU 108 in an intermediate-speed calibration pass/fail results portion of CPU memory 112 not shown in FIG. 4. Flow proceeds to decision block 648.

At decision block 648, the CPU 108 determines if the current delay tap 312 selection is the last delay tap 312 selection. If the current delay tap 312 selection is not the last delay tap 312 selection, then flow proceeds to block 652. If the current delay tap 312 selection is the last delay tap 312 selection, then flow proceeds to block 656.

At block 652, the CPU 108 loads the next delay tap 312 selection for all byte lanes 236 into the memory controller 156. There are at least two delay tap 312 selections available for the present invention, so block 652 is executed at least one time. In one embodiment, the next delay tap 312 selection is the sequentially adjacent delay tap 312 selection with faster timing than the previous delay tap 312 selection. In another embodiment, the next delay tap 312 selection is the sequentially adjacent delay tap 312 selection with slower timing than the previous delay tap 312 selection. Flow proceeds to block 624.

At block 656, for each byte lane 236, the CPU 108 identifies the optimal delay tap 312 selection for the longest string of consecutive pass indications. The CPU 108 analyzes the low-speed calibration pass/fail results 412 for a low-speed calibration, and the high-speed calibration pass/fail results 416 for a high-speed calibration. In a preferred embodiment, the optimal delay tap 312 selection corresponds to the centermost delay tap 312 selection in the longest string of consecutive pass indications. The optimal delay tap 312 selection is performed for all byte lanes 236 as described with reference to FIG. 5. Therefore, a delay tap 312 selection is identified for each byte lane 236, for the calibration speed corresponding to the current process of FIG. 6. Flow proceeds to block 660.

At block 660, the CPU 108 stores the identified delay tap 312 selection for each byte lane 236 in CPU memory 112. If the calibration was for low-speed operation, the CPU 108 stores the identified delay tap 312 selections in low speed calibration settings per byte lane 420. If the calibration was for high-speed operation, the CPU 108 stores the identified delay tap 312 selections in high speed calibration settings per byte lane 424. If the calibration was for intermediate-speed operation, the CPU 108 stores the identified delay tap 312 selections in an intermediate speed calibration settings per byte lane area of CPU memory 112, which is not shown in FIG. 4. It is advantageous and preferred to store all calibration settings 420, 424, plus any intermediate-speed calibration settings, in a non-volatile storage area such as non-volatile CPU memory 112, a storage device attached to device interface 128, or non-volatile memory 116. Storing calibration settings in a non-volatile data storage area allows for fast reconfiguration following a loss of main power 140, without requiring re-calibration at each supported volatile memory 120 operating speed. Flow proceeds to block 664.

At block 664, the memory controller 156 reads CPU memory 112, and stores the identified delay tap 312 selection for each byte lane 236 in timing delay parameter table 228. If the current process is being run for low-speed calibration, then memory controller 156 reads low-speed calibration settings per byte lane 420 and stores the settings 420 in timing delay parameter table 228. If the current process is being run for high-speed calibration, then memory controller 156 reads high-speed calibration settings per byte lane 424 and stores the settings 424 in timing delay parameter table 228. If the current process is being run for intermediate-speed calibration, then memory controller 156 reads intermediate-speed calibration settings per byte lane from CPU memory 112 and stores the intermediate-speed settings in timing delay parameter table 228. Flow ends at block 664.

At this point, the process of FIG. 6 may be performed again in order to obtain others of low, intermediate, or high-speed calibration settings. If all calibration settings for all supported low, intermediate, or high-speed calibration settings have been obtained and are stored in timing delay parameter table 228 of memory controller 156, the calibration process for volatile memory 120 is completed.

The process of FIG. 6 involves the memory controller 156, CPU 108, and CPU memory 112. However, other embodiments exist where the steps of the process of FIG. 6 are executed totally between memory controller 156 and volatile memory 120. Additionally, if the CPU 108, CPU memory 112, and clock generator 240 are integrated with the memory controller 156, then all steps shown in FIG. 6 could be performed within the single integrated device.

Figure 7:
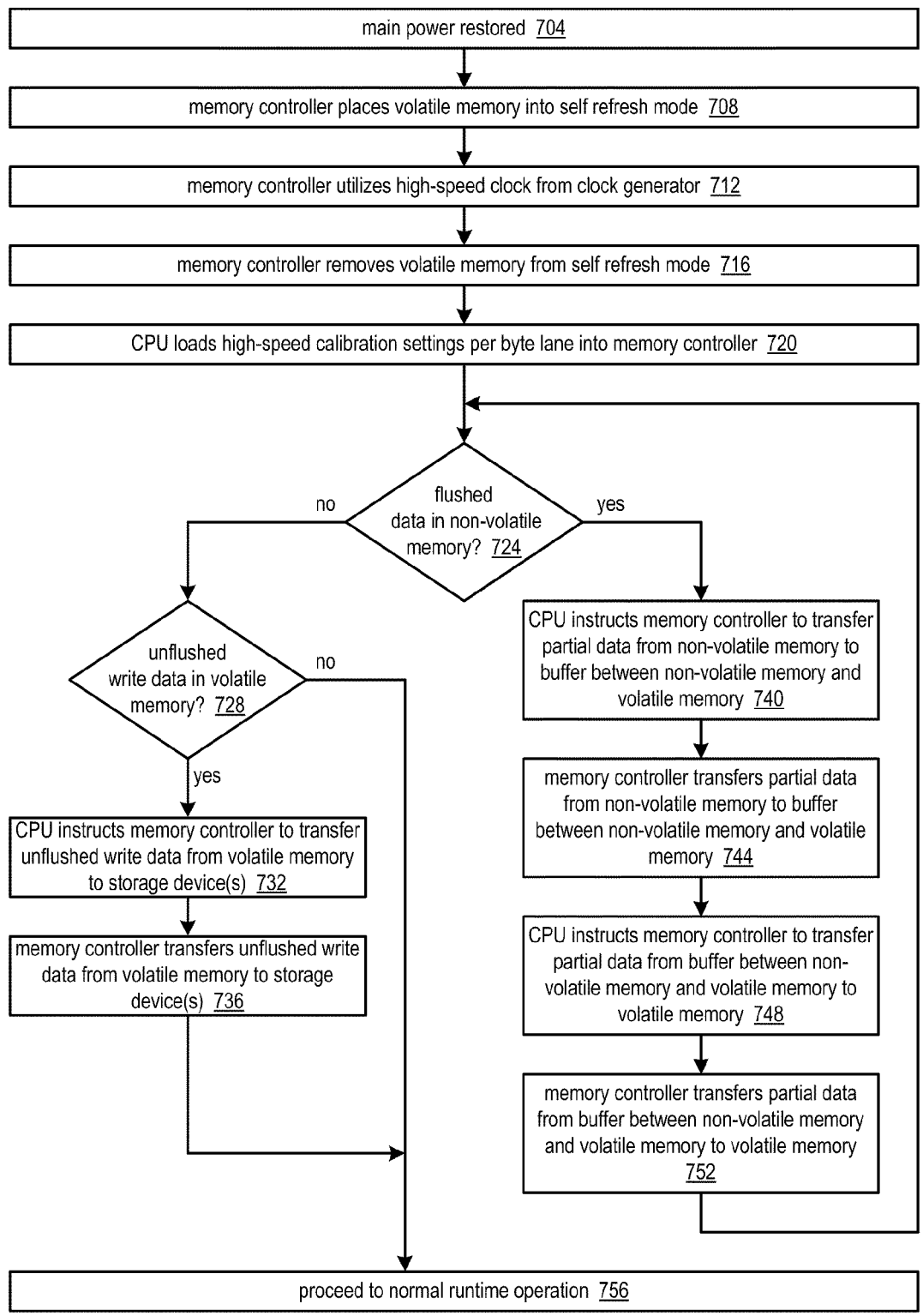
FIG. 7 is a flowchart illustrating a method for performing a power up sequence in accordance with an embodiment of the present invention.

Referring now to FIG. 7, a flowchart illustrating a method for performing a power up sequence in accordance with an embodiment of the present invention is shown. Flow begins at block 704.

At block 704, main power 140 is restored to the computing system 100. Main power 140 is restored on initial power-up of the computing system 100, or following a loss of main power 140 to computing system 100. Flow proceeds to block 708.

At block 708, the memory controller 156 places volatile memory 120 into self-refresh mode. Volatile memory 120 must be in self-refresh mode while clock frequencies to volatile memory 120 are being changed. Flow proceeds to block 712.

At block 712, the memory controller 156 utilizes a high-speed clock as the selected clock 248 from the clock generator 240. In a preferred embodiment, the high-speed clock corresponds to the highest specified operating speed of the volatile memory 120. In other embodiments, the high-speed clock corresponds to an operating speed lower than the highest specified operating speed of the volatile memory 120. Flow proceeds to block 716.

At block 716, the memory controller 156 removes volatile memory 120 from self-refresh mode. Flow proceeds to block 720.

At block 720, the CPU 108 loads high-speed calibration settings per byte lane 424 into the memory controller 156. These settings allow the memory controller 156 and volatile memory 120 to run reliably at the high-speed clock. Flow proceeds to decision block 724.

At decision block 724, the CPU 108 determines if there is flushed data in non-volatile memory 116. Flushed data would be present in non-volatile memory 116 following a flush operation of FIG. 8, 9, or 19-21. If there is not flushed data in non-volatile memory 116, then flow proceeds to decision block 728. If there is flushed data in non-volatile memory 116, then flow proceeds to block 740.

At decision block 728, the CPU 108 determines if there is unflushed write data in volatile memory 120. Unflushed write data may remain in volatile memory 120 if the time that main power 140 was lost is less than the time required to flush data from the volatile memory 120 to the non-volatile memory 116. In that case, when main power 140 is restored, some unflushed write data remains in volatile memory 120. If there is not unflushed write data in volatile memory 120, then flow proceeds to block 756. If there is unflushed write data in volatile memory 120, then flow proceeds to block 732.

At block 732, the CPU 108 instructs the memory controller 156 to transfer unflushed write data from volatile memory 120 to storage devices. Flow proceeds to block 736.

At block 736, the memory controller 156 transfers unflushed write data from volatile memory 120 to storage devices. At this point, all write data has been written to destination storage devices, and no further write data is at risk. Flow proceeds to block 756.

At block 740, the CPU 108 instructs the memory controller 156 to transfer partial data from the non-volatile memory 116 to the data buffer 224 between the non-volatile memory 116 and the volatile memory 120. Flow proceeds to block 744. In an alternative embodiment, the process skips the steps of blocks 744-752 and instead transfers all flush data in the non-volatile memory 116 directly to the volatile memory 120. After all flush data is transferred to the volatile memory 120, flow proceeds to decision block 724.

At block 744, the memory controller 156 transfers partial data from the non-volatile memory 116 to the data buffer 224 between the non-volatile memory 116 and the volatile memory 120. Flow proceeds to block 748.

At block 748, the CPU 108 instructs the memory controller 156 to transfer partial data from the data buffer 224 between the non-volatile memory 116 and the volatile memory 120 to the volatile memory 120. Flow proceeds to block 752.

At block 752, the memory controller 156 transfers partial data from the data buffer 224 between the non-volatile memory 116 and the volatile memory 120 to the volatile memory 120. Flow proceeds to decision block 724 to check if more flushed data remains in the non-volatile memory 116.

At block 756, the computing system 100 has transferred all flush data to storage devices, and is ready to resume normal I/O operations. Flow ends at block 756.

Referring now to FIG. 8, a flowchart illustrating a method for performing a volatile memory 120 flush process in accordance with a first embodiment of the present invention is shown. The first embodiment is where the volatile memory 120 includes only a single rank of volatile memory 120, such as volatile memory module 120a of FIG. 2. Flow begins at block 804.

At block 804, the computing system 100 loses main power 140. Flow proceeds to block 808.

At block 808, the power manager 132 generates a flush signal 160 to the memory controller 156. The power manager 132 detects the loss of main power 140 and responsively generates the flush signal 160 to the memory controller 156. Flow proceeds to block 812.

At block 812, the memory controller 156 places volatile memory 120 into self-refresh mode. Volatile memory 120 must be in self-refresh mode during any clock frequency change to the volatile memory 120. Flow proceeds to block 816.

At block 816, the memory controller 156 utilizes the low-speed clock from the clock generator 240. Flow proceeds to block 820.

At block 820, memory controller 156 removes the volatile memory 120 from self-refresh mode. Flow proceeds to block 824.

At block 824, the memory controller 156 loads low-speed calibration settings 420 for all byte lanes 236 and operates the volatile memory 120 with the low-speed calibration settings 420. In one embodiment, the low-speed calibration settings for all byte lanes 236 are stored in the memory controller local memory 216. In another embodiment, the low-speed calibration settings 420 are stored in the non-volatile memory 116 and the memory controller 156 retrieves the low-speed calibration settings 420 from the non-volatile memory 116. Flow proceeds to block 828.

At block 828, the memory controller 156 flushes partial data in the volatile memory 120 to a data buffer 224 between the volatile memory 120 and the non-volatile memory 116. In a preferred embodiment, the partial data is equal to the size of the data buffer 224. In other embodiments, the partial data is less than the size of the data buffer 224. Flow proceeds to block 832.

At block 832, the memory controller 156 places the volatile memory 120 into self-refresh mode. The volatile memory 120 consumes less power in self-refresh mode than normal operation. Flow proceeds to block 836.

At block 836, the memory controller 156 transfers the partial data from the data buffer 224 to the non-volatile memory 116. Once data is stored in the non-volatile memory 116, it is safe from any prolonged loss of main power 140. Flow proceeds to decision block 840.

At decision block 840, the memory controller 156 determines if there is more data remaining in the volatile memory 120 that needs to be flushed to non-volatile memory 116. If there is more data remaining in the volatile memory 120 that needs to be flushed to non-volatile memory 116, then flow proceeds to block 848. If there is not more data remaining in the volatile memory 120 that needs to be flushed to non-volatile memory 116, then flow proceeds to block 844.

At block 844, the volatile memory 120 flush is completed, and all data in volatile memory 120 that must be flushed has been transferred to the non-volatile memory 116. At this point, the memory controller 156 asserts a flush completed 172 signal to the power manager 132. The flush completed 172 signal causes the power manager 132 to stop providing backup power 152 to selected power 164, in order to preserve remaining backup power 152 from the backup power source 136. This is generally a valuable feature for any backup power source 136, but especially for non-rechargeable backup power sources 136 with a declining amount of available backup power 152. Flow ends at block 844.

At block 848, the memory controller 156 selects next partial data in the volatile memory 120. The next partial data is data in the volatile memory 120 that needs to be flushed to the non-volatile memory 116, and has not yet been flushed. Flow proceeds to block 852.

At block 852, the memory controller 156 takes the volatile memory 120 out of self-refresh mode. This prepares the volatile memory 120 for a next transfer of partial data to non-volatile memory 116 in blocks 828 through 836. Flow proceeds to block 828.

Referring now to FIG. 9a, a flowchart illustrating a first portion of a method for performing a volatile memory 120 flush process in accordance with a second embodiment of the present invention is shown. The second embodiment is where the volatile memory 120 includes multiple ranks of volatile memory 120, such as volatile memory modules 120a and 120b of FIG. 2. Flow begins at block 904.

At block 904, the computing system 100 loses main power 140. Flow proceeds to block 908.

At block 908, the power manager 132 generates a flush signal 160 to the memory controller 156. The power manager 132 detects the loss of main power 140 and generates the flush signal 160 to the memory controller 156. Flow proceeds to block 912.

At block 912, the memory controller 156 places volatile memory 120 into self-refresh mode. Volatile memory 120 must be in self-refresh mode during any clock frequency change to the volatile memory 120. Flow proceeds to block 916.

At block 916, the memory controller 156 utilizes the low-speed clock from the clock generator 240. Flow proceeds to block 920.

At block 920, memory controller 156 removes the volatile memory 120 from self-refresh mode. Flow proceeds to block 924.

At block 924, the memory controller 156 loads low-speed calibration settings 420 for all byte lanes 236 and operates the volatile memory 120 with the low-speed calibration settings 420. In one embodiment, the low-speed calibration settings 420 for all byte lanes 236 are stored in the memory controller local memory 216. In another embodiment, the low-speed calibration settings 420 are stored in the non-volatile memory 116 and the memory controller 156 retrieves the low-speed calibration settings 420 from the non-volatile memory 116. Flow proceeds to block 928.

At block 928, the memory controller 156 selects a first rank of volatile memory 120 containing data to be flushed as the current rank, and places all other ranks of volatile memory 120 into self-refresh mode. Flow proceeds to block 932.

At block 932, the memory controller 156 transfers partial data in the current rank of volatile memory 120 to a data buffer 224 between the volatile memory 120 and the non-volatile memory 116. In a preferred embodiment, the partial data is equal to the size of the data buffer 224. In other embodiments, the partial data is less than the size of the data buffer 224. Flow proceeds to block 936.

At block 936, the memory controller 156 places the current rank of volatile memory 120 into self-refresh mode. The volatile memory 120 consumes less power in self-refresh mode than normal operation. Flow proceeds to block 940.

At block 940, the memory controller 156 transfers partial data from the data buffer 224 to the non-volatile memory 116. Once data is stored in the non-volatile memory 116, it is safe from any prolonged loss of main power 140. Flow proceeds to decision block 944.

At decision block 944, the memory controller 156 determines if there is more data remaining in the current rank of volatile memory 120 that needs to be flushed to non-volatile memory 116. If there is more data remaining in the volatile memory 120 that needs to be flushed to non-volatile memory 116, then flow proceeds to block 948. If there is not more data remaining in the volatile memory 120 that needs to be flushed to non-volatile memory 116, then flow proceeds to block 956 of FIG. 9b.

At block 948, the memory controller 156 selects next partial data in the current rank of volatile memory 120. The next partial data is data in the current rank of volatile memory 120 that needs to be flushed to the non-volatile memory 116, and has not yet been flushed. Flow proceeds to block 952.

At block 952, the memory controller 156 takes the current rank of volatile memory 120 out of self-refresh mode. This prepares the current rank of volatile memory 120 for a next transfer of partial data to non-volatile memory 116 in blocks 932 through 940. Flow proceeds to block 932.

Referring now to FIG. 9b, a flowchart illustrating a second portion of a method for performing a volatile memory 120 flush process in accordance with the second embodiment of the present invention is shown. Flow transitions to block 956 from decision block 944 of FIG. 9a.

At block 956, the memory controller 156 places the current rank of volatile memory 120 into self-refresh mode. Flow proceeds to decision block 960.

At decision block 960, the memory controller 156 determines if the current rank is the last rank of volatile memory 120 containing data that must be flushed. For example, other ranks of volatile memory 120 may contain data, but the data may be of a type (such as read cache data) that does not need to be saved. If the current rank is the last rank of volatile memory 120 that contains data that must be flushed, then flow proceeds to block 976. If the current rank is not the last rank of volatile memory 120 that contains data that must be flushed, then flow proceeds to block 964.

At block 964, the memory controller 156 selects a next rank of volatile memory 120 containing data that must be flushed as the current rank. Flow proceeds to block 968.

At block 968, memory controller 156 takes the current rank of volatile memory 120 out of self-refresh mode. Flow proceeds to block 972.

At block 972, the memory controller 120 places all other ranks of volatile memory 120 other than the current rank into self-refresh mode. This step sets up a next rank of volatile memory 120 for a flush operation to non-volatile memory 116. Flow proceeds to block 932 of FIG. 9a to flush next partial data.

At block 976, the volatile memory 120 flush is completed, and all data in all ranks of volatile memory 120 that must be flushed has been transferred to the non-volatile memory 116. At this point, the memory controller 156 asserts a flush completed 172 signal to the power manager 132. In one embodiment, the flush completed 172 signal causes the power manager 132 to stop providing backup power 152 to selected power 164, in order to preserve remaining backup power 152 from the backup power source 136. This is generally a valuable feature for any backup power source 136, but especially non-rechargeable backup power sources 136 with a declining amount of available backup power 152. Flow ends at block 976.

Figure 10:
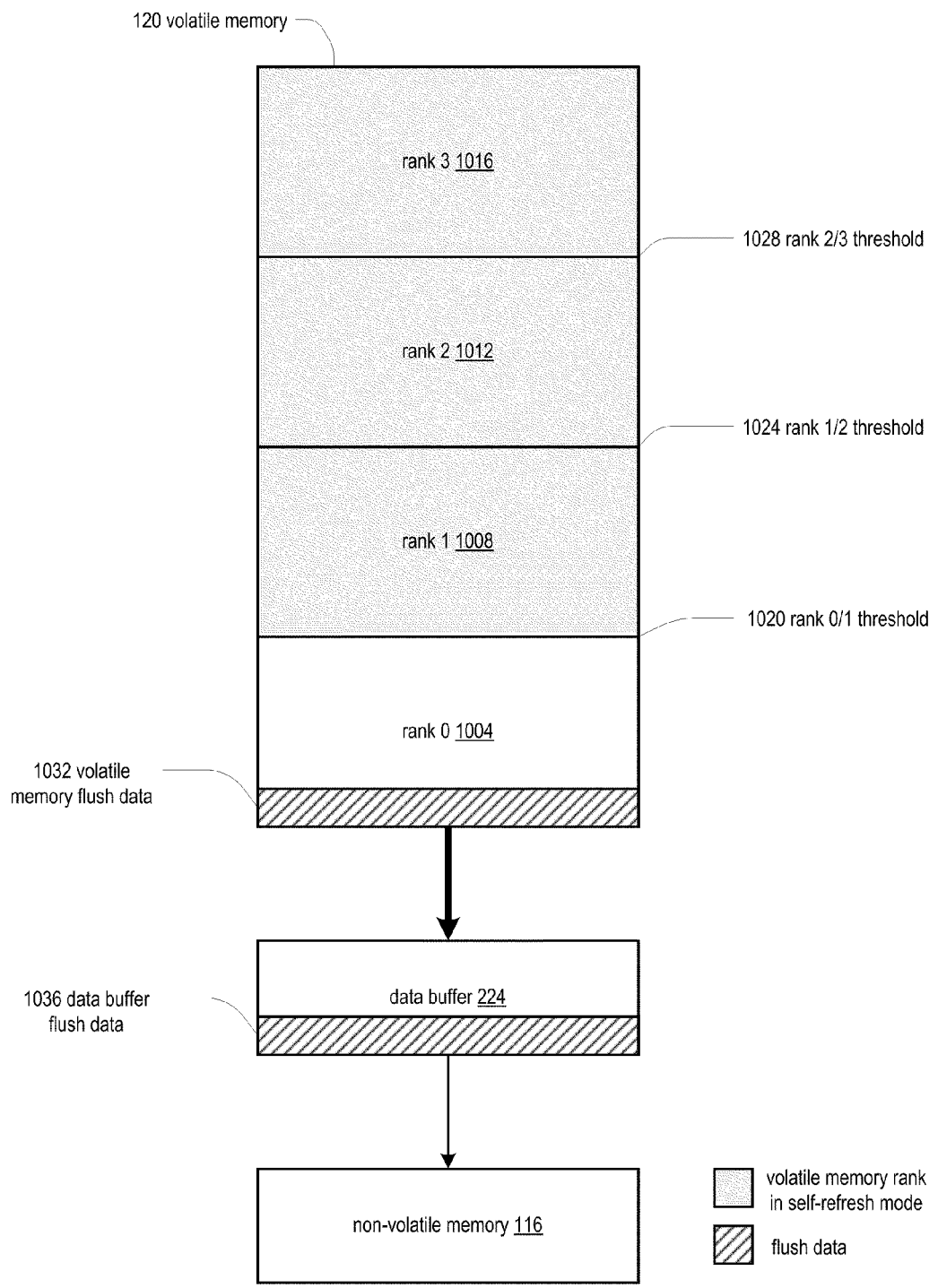
FIG. 10 is a block diagram illustrating a first part of a volatile memory flush operation in accordance with an embodiment of the present invention.

Referring now to FIG. 10, a block diagram illustrating a first part of a volatile memory 120 flush operation in accordance with an embodiment of the present invention is shown. The illustrated embodiment of a volatile memory 120 flush operation features a volatile memory 120 featuring four separate ranks, identified as rank 0 1004, rank 1 1008, rank 2 1012, and rank 3 1016. The ranks are arranged contiguously such that rank 0 1004 transitions to rank 1 1008 at rank 0/1 threshold 1020, rank 1 1008 transitions to rank 2 1012 at rank 1/2 threshold 1024, and rank 2 1012 transitions to rank 3 1016 at rank 2/3 threshold 1028.

All four ranks of volatile memory 120 are coupled to data buffer 224. Data buffer 224 is coupled to non-volatile memory 116. Once a flush operation is initiated by the power manager 132 generating flush 160 to the memory controller 156, the memory controller 156 first identifies a first rank of volatile memory 120 containing data that must be saved. In the example of FIGS. 10-14, it is assumed that at least rank 0 1004 and rank 1 1008 contain data that must be flushed.

The memory controller 156 begins the flush operation by transferring volatile memory flush data 1032 from rank 0 1004 to data buffer flush data 1036 in data buffer 224. The flush process proceeds to FIG. 11.

Figure 11:
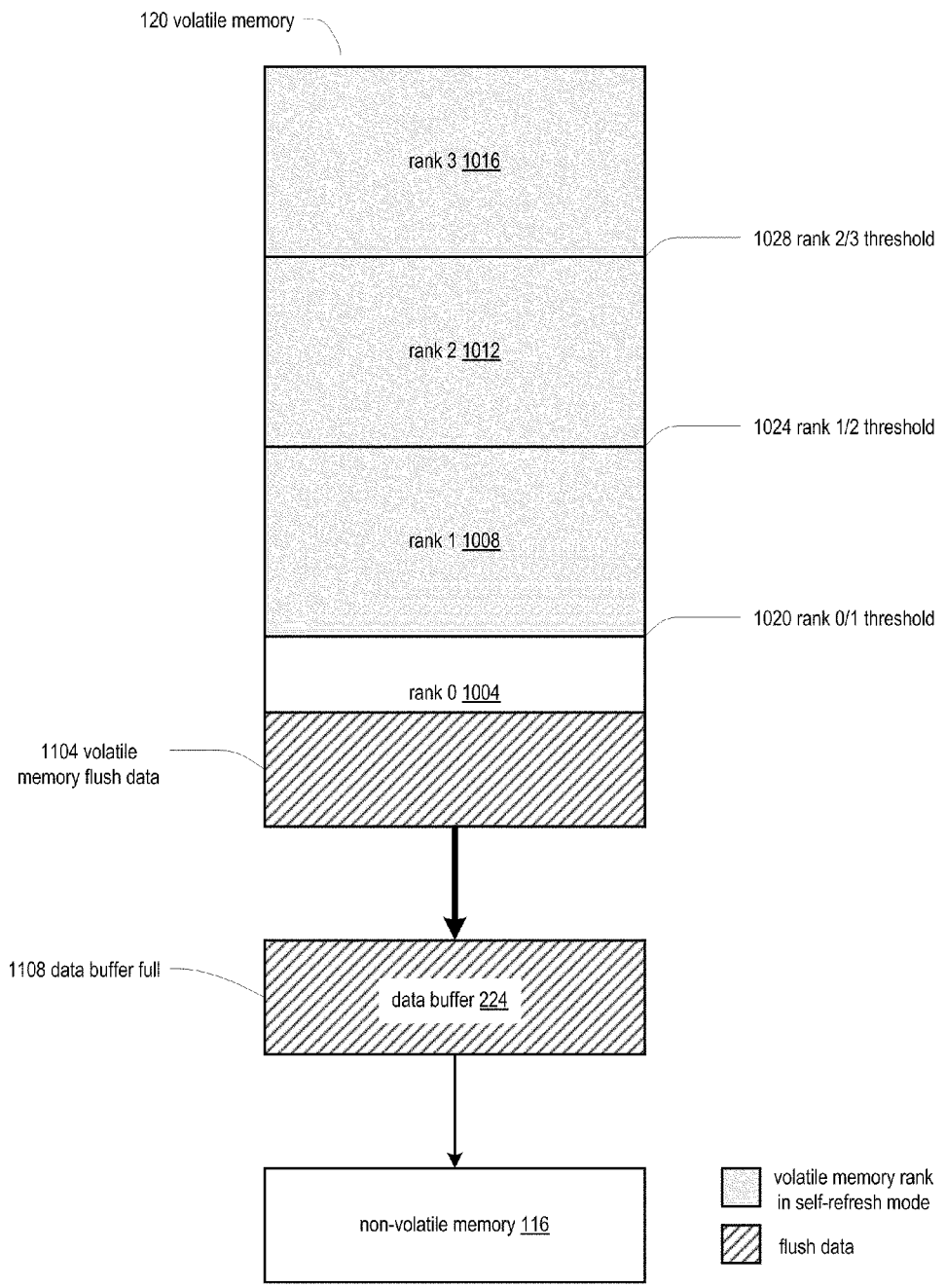
FIG. 11 is a block diagram illustrating a second part of a volatile memory flush operation in accordance with an embodiment of the present invention.

Referring now to FIG. 11, a block diagram illustrating a second part of a volatile memory 120 flush operation in accordance with an embodiment of the present invention is shown. The second part of the illustrated flush operation fills the data buffer 224 until the data buffer 224 is full.

Memory controller 156 continues active data transfer from volatile memory 120 to data buffer 224. At some point, volatile memory flush data 1104 is transferred to the data buffer 224, and the data buffer is full 1108. The amount of volatile memory flush data 1104 is equal to the amount of data in the full data buffer 1108. The flush process proceeds to FIG. 12.

Figure 12:
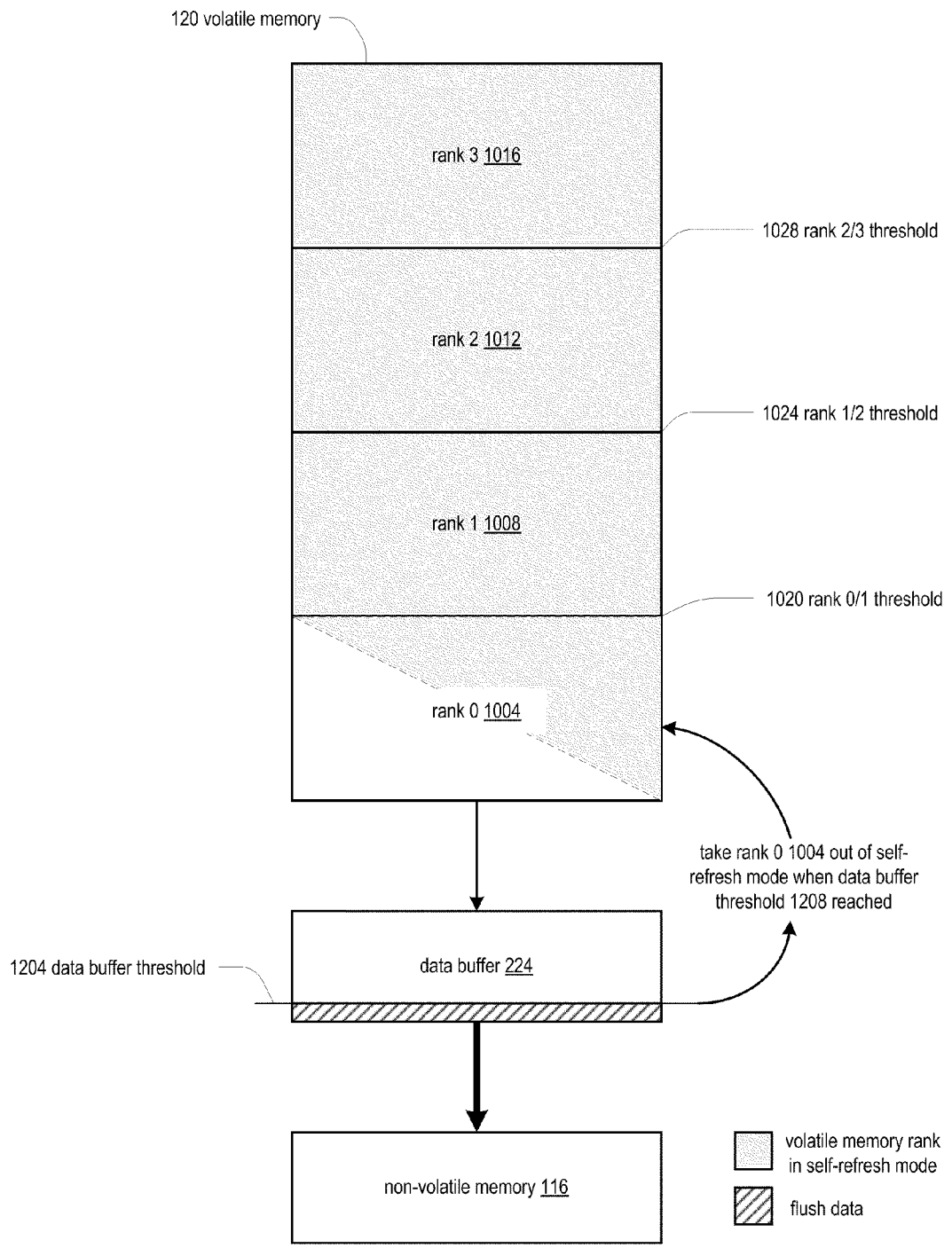
FIG. 12 is a block diagram illustrating a third part of a volatile memory flush operation in accordance with an embodiment of the present invention.

Referring now to FIG. 12, a block diagram illustrating a third part of a volatile memory 120 flush operation in accordance with an embodiment of the present invention is shown. After the data buffer 224 is full, the flush process next fills the non-volatile memory 116 from the data buffer 224.

A predetermined data buffer threshold 1208 is established prior to the flush operation, and indicates a data level in the data buffer 224 that allows the memory controller 156 to initiate various operations to allow the flush operation to be completed sooner than otherwise possible and consume less backup power 152. The data buffer threshold 1208 is fixed, and only is used when the memory controller 156 is transferring data from the data buffer 224 to the non-volatile memory 116.

The data transfer rate to fill the non-volatile memory 116 from the data buffer 224 is fixed and known, and depends on the write speed of the non-volatile memory 116. In general, the data transfer rate from the volatile memory 120 is significantly greater than the data transfer rate to the non-volatile memory 116. In order to consume minimal power during the flush operation, it is desirable to maintain a constant data rate to the slower non-volatile memory 116, while maximizing the time the volatile memory 120 is in self-refresh mode. Therefore, all ranks of volatile memory 120 not actively involved in the flush operation are maintained using self-refresh. As shown in FIG. 12, rank 1 1008, rank 2 1012, and rank 3 1016 are in self-refresh while rank 0 1004 is being flushed. Additionally, it takes a predetermined amount of time to bring memory devices 220 out of self-refresh mode, so they can be accessed using reads or writes.

The data buffer threshold 1204 is set such that the time to transfer any remaining data in the data buffer 224 to the non-volatile memory 116 is approximately equal to the time the memory devices 220 require to transition from self-refresh mode to active reading. The maximum time for memory devices 220 to transition from self-refresh mode to active reading is slightly less (100 nanoseconds, or more) than the time to transfer remaining data below the data buffer threshold 1204 from the data buffer 224 to the non-volatile memory 116. Therefore, once the memory controller 156 has completed transferring all data from the data buffer 224 to the non-volatile memory 116, the volatile memory 120 is guaranteed to be ready to transfer more flush data to the data buffer 224 with no delay. Setting the data buffer threshold 1204 in this fashion minimizes the power required to flush volatile memory 120 data to non-volatile memory 116. Without the data buffer threshold 1204, a computing system 100 would need to wait until all data had been transferred from the data buffer 224 to the non-volatile memory 116 before taking the active rank of volatile memory 120 out of self-refresh mode. The wait time would be equal to or greater than the maximum time the memory devices 220 required to transition from self-refresh mode to active reading. The flush process proceeds to FIG. 13.

Figure 13:
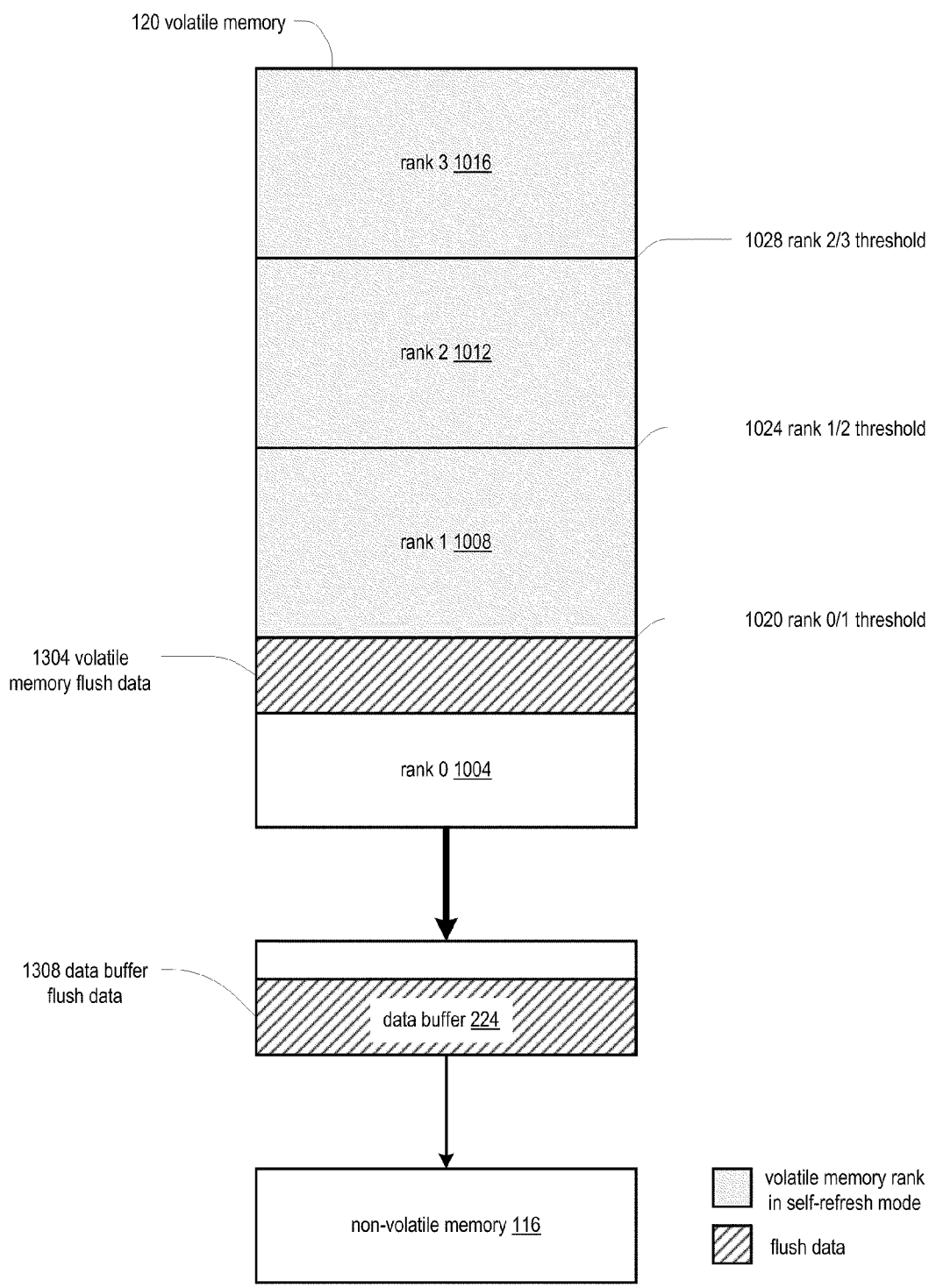
FIG. 13 is a block diagram illustrating a fourth part of a volatile memory flush operation in accordance with an embodiment of the present invention.

Referring now to FIG. 13, a block diagram illustrating a fourth part of a volatile memory 120 flush operation in accordance with an embodiment of the present invention is shown. After the data buffer 224 has been emptied to the non-volatile memory 116 in FIG. 12, the data buffer 224 is available to be filled with next flush data from volatile memory 120. FIG. 13 illustrates volatile memory flush data 1304 transferred to data buffer flush data 1308, where all flush data in rank 0 1004 has been transferred and the rank 0/1 threshold 1020 has been reached. Therefore, at the end of the process of FIG. 13, there is no more flush data remaining in rank 0 1004. Assuming data buffer 224 has space available for additional flush data, there are several possible options at this point, assuming more flush data is in another rank 1008, 1012, 1016 of volatile memory 120. These options and embodiments are described following FIG. 14. The flush process proceeds to FIG. 14.

Figure 14:
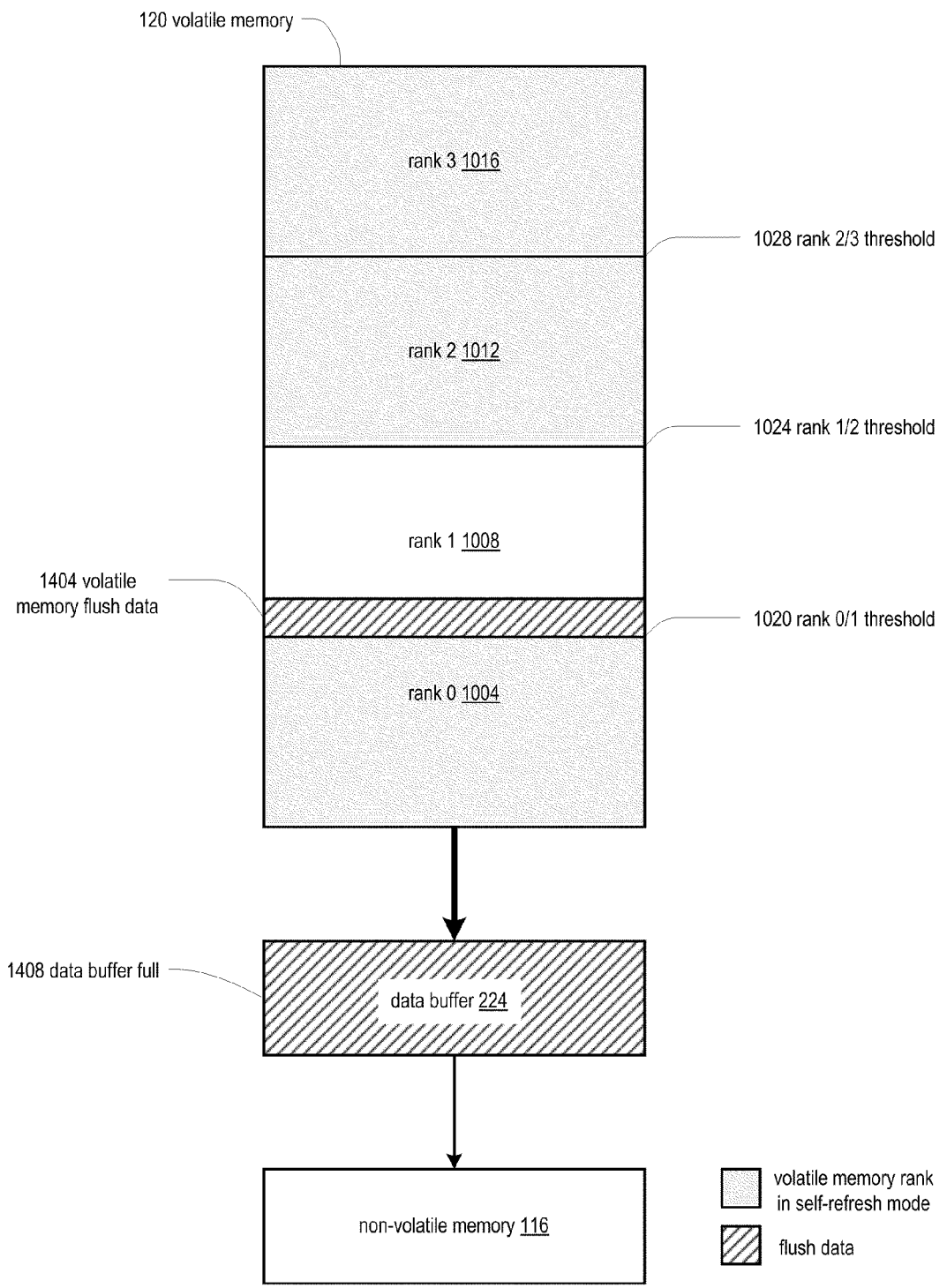
FIG. 14 is a block diagram illustrating a fifth part of a volatile memory flush operation in accordance with an embodiment of the present invention.

Referring now to FIG. 14, a block diagram illustrating a fifth part of a volatile memory flush operation in accordance with an embodiment of the present invention is shown. FIG. 14 illustrates the case where the data buffer 224 is filled from the next rank of volatile memory 120 containing flush data. Memory controller 156 first puts rank 0 1004 into self-refresh mode, and takes rank 1 1008 out of self-refresh mode. Once rank 1 1008 is out of self-refresh mode, the memory controller 156 transfers volatile memory flush data 1404 to data buffer 224 such that data buffer 224 is full 1408. At this point, the data buffer 224 contents are transferred to the non-volatile memory 116 as shown in FIG. 12, and the process of FIGS. 10-14 repeats until all data has been flushed from all ranks of volatile memory 120 to non-volatile memory 116.

There are several options available for optimizing power reduction during flush operations, depending on apparatus and process complexity and the amount of desired power savings. Some embodiments utilize the data buffer threshold 1204 in FIG. 12 while transferring data from the data buffer 224 to the non-volatile memory 116, but differ in how the volatile memory 120 ranks are managed while transferring data to the data buffer 224. Each embodiment assumes the situation shown in FIG. 13, where the data buffer 224 is not full, the current rank has no more flush data to be transferred, and at least one other rank has flush data to be transferred.

In a first embodiment, the memory controller 156 attempts to maximize the data buffer 224 being full. The data buffer 224 is not emptied to non-volatile memory 116 unless the data buffer 224 is full, or there is no more flush data remaining in any rank of volatile memory 120. In this embodiment, the only time a less than full data buffer 224 will be emptied to non-volatile memory 116 is at the end of a flush operation when there is no more flush data in volatile memory 120.

Figure 15:
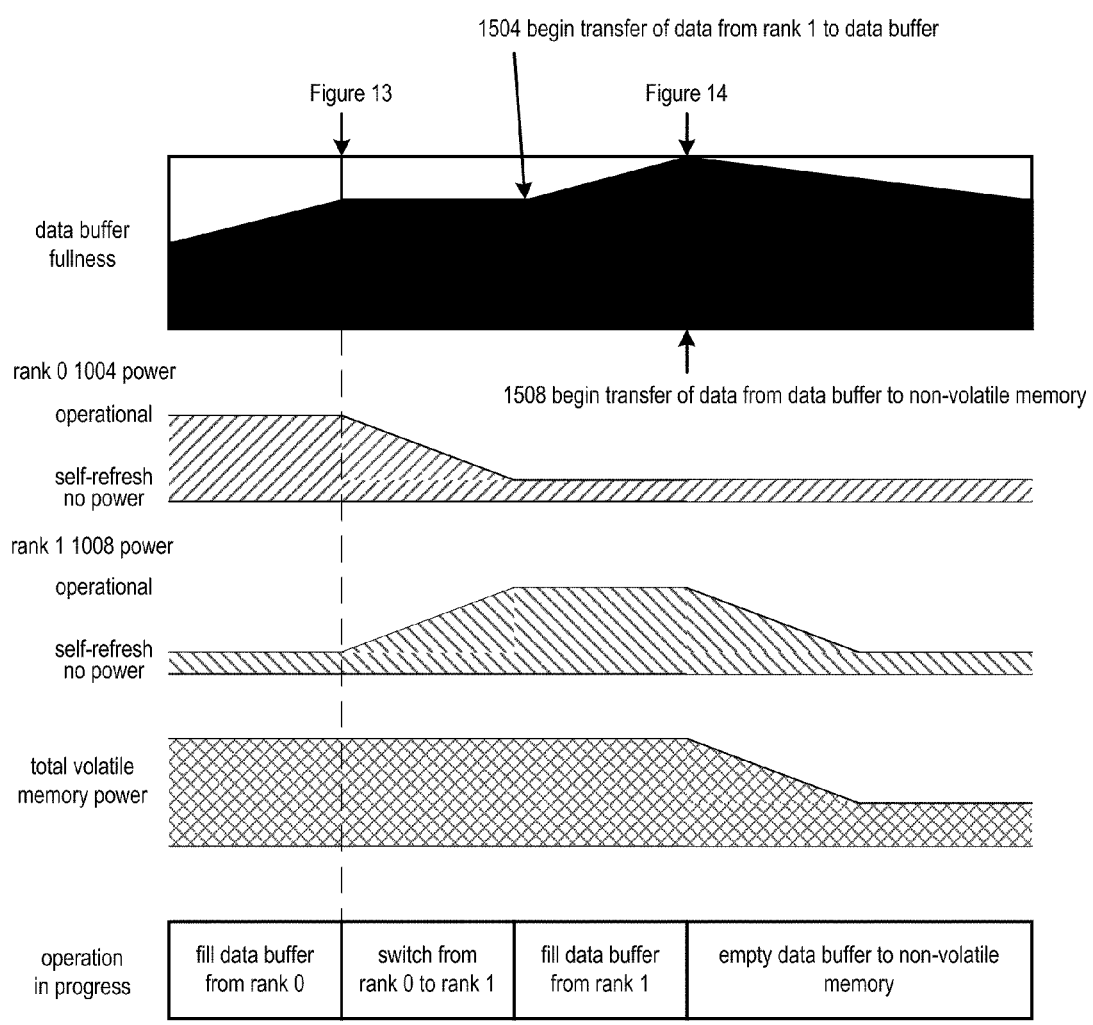
FIG. 15 is a block diagram illustrating a volatile memory power profile during transition between volatile memory banks according to a first embodiment of the present invention.

Referring now to FIG. 15, a block diagram illustrating a volatile memory 120 power profile during transition between volatile memory 120 ranks according to a first embodiment of the present invention is shown. The horizontal axis is time. The left side assumes sometime between FIGS. 12 and 13, when the memory controller 156 is transferring flush data from rank 0 1004 to data buffer 224. The arrow at FIG. 13 is at the end of the process step of FIG. 13, where the data buffer 224 is not full, but all flush data has been transferred out of rank 0 1004 and more flush data is in rank 1 1008.

Relative to FIG. 13, in the first embodiment the memory controller 156 pauses any accesses to or from the data buffer 224 while the memory controller 156 places rank 0 1004 into self-refresh mode and takes rank 1 1008 out of self-refresh mode. Once rank 1 is out of self-refresh mode (i.e. in operational mode), the memory controller 156 transfers volatile memory flush data from rank 1 1008 to the data buffer 224 to make data buffer full 1408, as shown in FIG. 14. The arrow at FIG. 14 is the situation shown in FIG. 14, where the data buffer 224 is full and the memory controller 156 starts preparing to flush data to the non-volatile memory 116. The first embodiment has the advantage of simplicity, while still utilizing self-refresh mode for inactive ranks of volatile memory 120.

In a second embodiment, the data buffer 224 is emptied by memory controller 156 to non-volatile memory 116 while the memory controller takes rank 1 1008 out of self-refresh mode and puts rank 0 1004 into self-refresh mode. This is the same action that is taken as a result of passing the data buffer threshold 1204 in FIG. 12. Therefore, in the second embodiment the data buffer threshold 1204 is ignored since rank switching is already occurring.

Referring now to FIG. 16a, a block diagram illustrating a volatile memory 120 power profile during transition between volatile memory ranks according to a first condition of a second embodiment of the present invention is shown. FIG. 16a reflects a condition whereby there is a relatively small amount of flush data in the data buffer 224 when the rank 0/1 threshold 1020 is reached and there is no more flush data in rank 0 1004 that needs to be saved. If rank 1 1008 is not out of self-refresh mode before the data buffer 224 is empty, the memory controller 156 waits for rank 1 1008 to come out of self-refresh mode and become operational before transferring flush data from rank 1 1008 to the data buffer 224. Reference 1604 shows the time that the memory controller 156 begins transfer of flush data from the data buffer 224 to the non-volatile memory 116. Reference 1608 shows the time when the transfer of flush data from the data buffer 224 to the non-volatile memory 116 is completed. Reference 1612 shows the time when the memory controller 156 begins transfer of flush data from rank 1 1008 to the data buffer 224.

Referring now to FIG. 16*b*, a block diagram illustrating a volatile memory 120 power profile during transition between volatile memory 120 ranks according to a second condition of the second embodiment of the present invention is shown. FIG. 16*b* reflects a condition whereby there is a relatively large amount of flush data in the data buffer 224 when the rank 0/1 threshold 1020 is reached and there is no more flush data in rank 0 1004 that needs to be saved. If rank 1 1008 is out of self-refresh mode and is operational before the data buffer 224 is empty, the memory controller 156 stops emptying the data buffer 224 to non-volatile memory 116 and instead starts transferring flush data from rank 1 1008 to available locations of the data buffer 224. Reference 1604 shows the time that the memory controller 156 begins transfer of flush data from the data buffer 224 to the non-volatile memory 116. Reference 1616 shows the time that the memory controller 156 begins transfer of flush data from rank 1 1008 to the data buffer 224.

In a third embodiment, the data buffer 224 is emptied by memory controller 156 to non-volatile memory 116 while the memory controller 156 puts rank 0 1004 into self-refresh mode. However, the memory controller 156 waits until the data buffer 224 data transfer to non-volatile memory 116 is at the data buffer threshold 1204 before taking rank 1 1008 out of self-refresh mode.

Referring now to FIG. 17*a*, a block diagram illustrating a volatile memory 120 power profile during transition between volatile memory 120 ranks according to a first condition of the third embodiment of the present invention is shown. In the first condition shown in FIG. 17*a*, the data in the data buffer 224 is already below the data buffer threshold 1204. Since the data in the data buffer 224 is already below the data buffer threshold 1204, the first condition of the third embodiment operates in the same manner as the first condition of the second embodiment shown in FIG. 16*a*. Reference 1704 shows the time that the memory controller 156 begins the transfer of flush data from the data buffer 224 to the non-volatile memory 116. Reference 1708 shows the time that the memory controller 156 completes the transfer of flush data from the data buffer 224 to the non-volatile memory 116. Reference 1712 shows the time that the memory controller 156 begins transferring flush data from rank 1 1008 to the data buffer 224.

Referring now to FIG. 17*b*, a block diagram illustrating a volatile memory 120 power profile during transition between volatile memory 120 ranks according to a second condition of the third embodiment of the present invention is shown. Reference 1704 shows the time that the memory controller 156 begins the transfer of flush data from the data buffer 224 to the non-volatile memory 116. Reference 1708 shows the time that the memory controller 156 completes the transfer of flush data from the data buffer 224 to the non-volatile memory 116. Reference 1712 shows the time that the memory controller 156 begins transferring flush data from rank 1 1008 to the data buffer 224. Reference 1716 shows the time that the flush data level in the data buffer 224 passes the data buffer threshold 1204. The third embodiment has an advantage over the first and second embodiments of delaying taking rank 1 1008 out of self-refresh mode until the data buffer threshold 1204 is passed, thereby consuming less power. Data buffer 224 efficiency is maximized since the data buffer is always transferring data—whether from rank 0 1004/rank 1 1008 to the data buffer 224, or from data buffer 224 to non-volatile memory 116.

In a fourth embodiment, the data buffer 224 is emptied by memory controller 156 to non-volatile memory 116 while the memory controller 156 puts rank 0 1004 into self-refresh mode and provides an indication 168 to the power manager 132 that rank 0 does not require further power. Once all flush data in any rank has been transferred to data buffer 224, there is no further need to maintain power to such a rank. Removing power from a rank consumes less backup power 152 than placing a rank into self-refresh mode. Similar to the third embodiment, the memory controller 156 waits until the data buffer 224 data transfer to non-volatile memory 116 is at the data buffer threshold 1204 before taking rank 1 1008 out of self-refresh mode.

Referring now to FIG. 18*a*, a block diagram illustrating a volatile memory 120 power profile during transition between volatile memory 120 ranks according to a first condition of the fourth embodiment of the present invention is shown. In the first condition shown in FIG. 18*a*, the data in the data buffer 224 is already below the data buffer threshold 1204. Since the data in the data buffer 224 is already below the data buffer threshold 1204, the first condition of the third embodiment operates similar to the first condition of the third embodiment shown in FIG. 17*a*.

Reference 1804 shows the time that the memory controller 156 begins the transfer of flush data from the data buffer 224 to the non-volatile memory 116. Reference 1808 shows the time that the memory controller 156 completes the transfer of flush data from the data buffer 224 to the non-volatile memory 116. Reference 1812 shows the time that the memory controller 156 begins transferring flush data from rank 1 1008 to the data buffer 224. Reference 1820 shows the power manager 132 removes selected power 164 to rank 0 1004 of volatile memory 120 after the memory controller 156 asserts remove rank 0 power 168 to the power manager 132. After all flush data has been transferred from rank 0 1004 to the data buffer 224 (FIG. 13 reference), the memory controller 156 begins to place rank 0 1004 into self-refresh mode at the same time the memory controller 156 asserts remove rank 0 power 168 to the power manager 132. Sometime later, the power manager 132 removes selected power 164 to rank 0 1004 of volatile memory 120.

Referring now to FIG. 18*b*, a block diagram illustrating a volatile memory 120 power profile during transition between volatile memory 120 ranks according to a second condition of the fourth embodiment of the present invention is shown. The fourth embodiment has an advantage over the other embodiments of removing power to volatile memory 120 ranks that have already flushed all necessary data to non-volatile memory 116, thereby consuming less power. However, this reduction in backup power 152 consumption comes at the expense of additional complexity to the memory controller 156 and power manager 132.

Reference 1804 shows the time that the memory controller 156 begins the transfer of flush data from the data buffer 224 to the non-volatile memory 116. Reference 1808 shows the time that the memory controller 156 completes the transfer of flush data from the data buffer 224 to the non-volatile memory 116. Reference 1812 shows the time that the memory controller 156 begins transferring flush data from rank 1 1008 to the data buffer 224. Reference 1816 shows the time that the flush data level in the data buffer 224 passes the data buffer threshold 1204. Reference 1820 shows the power manager 132 removes selected power 164 to rank 0 1004 of volatile memory 120 after the memory controller 156 asserts remove rank 0 power 168 to the power manager 132. After all flush data has been transferred from rank 0 1004 to the data buffer 224 (FIG. 13 reference), the memory controller 156 begins to place rank 0 1004 into self-refresh mode at the same time the memory controller 156 asserts remove rank 0 power 168 to the power manager 132. Sometime later, the power manager 132 removes selected power 164 to rank 0 1004 of volatile memory 120.

Referring now to FIG. 19, a flowchart illustrating a single rank volatile memory 120 flush operation using a buffer threshold 1204 in accordance with a first embodiment of the present invention is shown. The first embodiment is where the volatile memory 120 includes only a single rank 120a of volatile memory 120, such as volatile memory module 120a of FIG. 2. Flow begins at block 1904.

At block 1904, the computing system 100 loses main power 140. Flow proceeds to block 1908.

At block 1908, the power manager 132 generates a flush signal 160 to the memory controller 156. The power manager 132 detects the loss of main power 140 and responsively generates the flush signal 160 to the memory controller 156. Flow proceeds to block 1912.

At block 1912, the memory controller 156 places volatile memory 120 into self-refresh mode. Volatile memory 120 must be in self-refresh mode during any clock frequency change to the volatile memory 120. Flow proceeds to block 1916.

At block 1916, the memory controller 156 utilizes the low-speed clock 248 from the clock generator 240. Flow proceeds to block 1920.

At block 1920, memory controller 156 removes the volatile memory 120 from self-refresh mode. Flow proceeds to block 1924.

At block 1924, the memory controller 156 transfers partial data in the volatile memory 120 to a data buffer 224 between the volatile memory 120 and the non-volatile memory 116. In a preferred embodiment, the partial data is equal to the size of the data buffer 224. In other embodiments, the partial data is less than the size of the data buffer 224. Flow proceeds to block 1928.

At block 1928, the memory controller 156 places the volatile memory 120 into self-refresh mode. The volatile memory 120 consumes less power in self-refresh mode than in normal operation. Flow proceeds to block 1932.

At block 1932, the memory controller 156 transfers partial data from the data buffer 224 to the non-volatile memory 116. Once data is stored in the non-volatile memory 116, it is safe from any prolonged loss of main power 140. Flow proceeds to decision block 1936.

At decision block 1936, the memory controller 156 determines if the amount of partial data in the data buffer 224 is less than the data buffer threshold 1204. If the amount of partial data in the data buffer 224 is less than the data buffer threshold 1204, then there is no need to check the data buffer threshold 1204 in decision block 1940, and flow proceeds to decision block 1944. If the amount of partial data in the data buffer 224 is not less than the data buffer threshold 1204, then flow proceeds to decision block 1940.

At decision block 1940, the memory controller 156 determines if the data buffer threshold 1204 has been reached. If the data buffer threshold 1204 has been reached, then flow proceeds to decision block 1944. If the data buffer threshold 1204 has not been reached, then flow proceeds to block 1932 to continue transferring partial data from the data buffer 224 to the non-volatile memory 116.

At decision block 1944, the memory controller 156 determines if there is more flush data remaining in volatile memory 120. If there is not more flush data remaining in volatile memory 120, then flow proceeds to block 1948. If there is more flush data remaining in volatile memory 120, then flow proceeds to blocks 1956 and 1960.

At block 1948, the memory controller 156 transfers any remaining partial data in the data buffer 224 to non-volatile memory 116. Flow proceeds to block 1952.

At block 1952, the volatile memory 120 flush is completed, and all data in volatile memory 120 that must be flushed has been transferred to the non-volatile memory 116. At this point, the memory controller 156 asserts a flush completed 172 signal to the power manager 132. The flush completed 172 signal causes the power manager 132 to stop providing backup power 152 to selected power 164, in order to preserve remaining backup power 152 from the backup power source 136. This is generally a valuable feature for any backup power source 136, but especially non-rechargeable backup power sources 136 with a declining amount of available backup power 152. Flow ends at block 1952.

At block 1956, the memory controller 156 transfers any remaining partial data in the data buffer 224 to non-volatile memory 116. Flow proceeds to block 1924 to transfer next partial flush data.

At block 1960, the memory controller 156 selects next partial data in the volatile memory 120. The next partial data is data in the volatile memory 120 that needs to be flushed to the non-volatile memory 116, and has not yet been flushed. Flow proceeds to block 1964.

At block 1964, the memory controller 156 takes the volatile memory 120 out of self-refresh mode. This prepares the volatile memory 120 for a next transfer of partial data from volatile memory 120 to the data buffer 224 in blocks 1912 through 1928. Flow proceeds to block 1924 to transfer next partial flush data.

Referring now to FIG. 20a, a flowchart illustrating a first part of a first multiple rank volatile memory 120 flush operation embodiment using a buffer threshold 1204 in accordance with the present invention is shown. The multiple rank embodiment in FIG. 20a is where the volatile memory 120 includes two or more ranks of volatile memory 120, such as volatile memory modules 120a and 120b of FIG. 2. Flow begins at block 2004.

At block 2004, the computing system 100 loses main power 140. Flow proceeds to block 2008.

At block 2008, the power manager 132 generates a flush signal 160 to the memory controller 156. The power manager 132 detects the loss of main power 140 and responsively generates the flush signal 160 to the memory controller 156. Flow proceeds to block 2012.

At block 2012, the memory controller 156 places volatile memory 120 into self-refresh mode. Volatile memory 120 must be in self-refresh mode during any clock frequency change to the volatile memory 120. Flow proceeds to block 2016.

At block 2016, the memory controller 156 utilizes the low-speed clock 248 from the clock generator 240. Flow proceeds to block 2020.

At block 2020, memory controller 156 removes the volatile memory 120 from self-refresh mode. Flow proceeds to block 2024.

At block 2024, the memory controller 156 selects a first rank of volatile memory 120 as the current rank, and places all other ranks of volatile memory 120 other than the first rank into self-refresh mode. Flow proceeds to block 2028.

At block 2028, the memory controller 156 transfers partial data in the current rank of volatile memory 120 to a data buffer 224 between the volatile memory 120 and the non-volatile memory 116. In a preferred embodiment, the partial data is equal to the size of the data buffer 224. In other embodiments, the partial data is less than the size of the data buffer 224. Flow proceeds to block 2032.

At block 2032, the memory controller 156 places the current rank of volatile memory 120 into self-refresh mode. The volatile memory 120 consumes less power in self-refresh mode than in normal operation. Flow proceeds to block 2036.

At block 2036, the memory controller 156 transfers partial data from the data buffer 224 to the non-volatile memory 116. Once data is stored in the non-volatile memory 116, it is safe from any prolonged loss of main power 140. Flow proceeds to decision block 2040.

At decision block 2040, the memory controller 156 determines if the amount of partial data in the data buffer 224 is less than the data buffer threshold 1204. If the amount of partial data in the data buffer 224 is less than the data buffer threshold 1204, then there is no need to check the data buffer threshold 1204 in decision block 2044, and flow proceeds to decision block 2048 of FIG. 20B. If the amount of partial data in the data buffer 224 is not less than the data buffer threshold 1204, then flow proceeds to decision block 2044.

At decision block 2044, the memory controller 156 determines if the data buffer threshold 1204 has been reached. If the data buffer threshold 1204 has been reached, then flow proceeds to decision block 2048 of FIG. 20B. If the data buffer threshold 1204 has not been reached, then flow proceeds to block 2036 to continue transferring partial data from the data buffer 224 to the non-volatile memory 116.

Referring now to FIG. 20*b*, a flowchart illustrating a second part of a first multiple rank volatile memory 120 flush operation embodiment using a buffer threshold 1204 in accordance with the present invention is shown. Flow continues at decision block 2048.

At decision block 2048, the memory controller 156 determines if there is more flush data remaining in the current rank of volatile memory 120. If there is not more flush data remaining in the current rank of volatile memory 120, then flow proceeds to block 2064. If there is more flush data remaining in the current rank of volatile memory 120, then flow proceeds to blocks 2052 and 2056.

At block 2052, the memory controller 156 transfers any remaining partial data in the data buffer 224 to non-volatile memory 116. Flow proceeds to block 2028 of FIG. 20*a*.

At block 2056, the memory controller 156 selects next partial data in the current rank of volatile memory 120. The next partial data is data in the current rank of volatile memory 120 that needs to be flushed to the non-volatile memory 116, and has not yet been flushed. Flow proceeds to block 2060.

At block 2060, the memory controller 156 takes the current rank of volatile memory 120 out of self-refresh mode. This prepares the current rank of volatile memory 120 for a next transfer of partial data from volatile memory 120 to the data buffer 224 in blocks 2028 through 2036. Flow proceeds to block 2028 of FIG. 20*a* to transfer next partial flush data.

At block 2064, the memory controller 156 places the current rank of volatile memory 120 into self-refresh mode, since the current rank contains no more data that needs to be flushed to the non-volatile memory 116. Flow proceeds to decision block 2068.

At decision block 2068, the memory controller 156 determines if the current rank of volatile memory 120 is the last rank of volatile memory 120 containing data that must be flushed to non-volatile memory 116. If the current rank of volatile memory 120 is the last rank of volatile memory 120 containing data that must be flushed to non-volatile memory 116, then no more data needs to be flushed from volatile memory 120 and flow proceeds to block 2072. If the current rank of volatile memory 120 is not the last rank of volatile memory 120 containing data that must be flushed to non-volatile memory 116, then more data needs to be flushed from volatile memory 120 and flow proceeds to blocks 2080 and 2084.

At block 2072, the memory controller 156 transfers any remaining partial data in the data buffer 224 to non-volatile memory 116. Flow proceeds to block 2076.

At block 2076, the volatile memory 120 data flush is completed, and all data in volatile memory 120 that must be flushed has been transferred to the non-volatile memory 116. At this point, the memory controller 156 asserts a flush completed 172 signal to the power manager 132. The flush completed 172 signal causes the power manager 132 to stop providing backup power 152 to selected power 164, in order to preserve remaining backup power in the backup power source 136. This is generally a valuable feature for any backup power source 136, but especially non-rechargeable backup power sources 136 with a declining amount of available backup power 152. Flow ends at block 2076.

At block 2080, the memory controller 156 transfers any remaining partial data in the data buffer 224 to non-volatile memory 116. Flow proceeds to block 2028 of FIG. 20*a*.

At block 2084, the memory controller 156 selects a next rank of volatile memory 120 containing data that must be flushed as the current rank. Flow proceeds to block 2088.

At block 2088, the memory controller 156 places all other ranks of volatile memory 120 other than the current rank into self-refresh mode. Flow proceeds to block 2092.

At block 2092, memory controller 156 places all other ranks of volatile memory 120 other than the current rank into self-refresh mode. Flow proceeds to block 2028 of FIG. 20*a*.

Referring now to FIG. 21*a*, a flowchart illustrating a first part of a second multiple rank volatile memory 120 flush operation embodiment using a buffer threshold 1204 in accordance with the present invention is shown. The multiple rank embodiment in FIG. 21*a* is where the volatile memory 120 includes two or more ranks of volatile memory 120, such as volatile memory modules 120*a* and 120*b* of FIG. 2. Flow begins at block 2104.

At block 2104, the computing system 100 loses main power 140. Flow proceeds to block 2108.

At block 2108, the power manager 132 generates a flush signal 160 to the memory controller 156. The power manager 132 detects the loss of main power 140 and responsively generates the flush signal 160 to the memory controller 156. Flow proceeds to block 2112.

At block 2112, the memory controller 156 places volatile memory 120 into self-refresh mode. Volatile memory 120 must be in self-refresh mode during any clock frequency change to the volatile memory 120. Flow proceeds to block 2116.

At block 2116, the memory controller 156 utilizes the low-speed clock 248 from the clock generator 240. Flow proceeds to block 2120.

At block 2120, memory controller 156 removes the volatile memory 120 from self-refresh mode. Flow proceeds to block 2124.

At block 2124, the memory controller 156 selects a first rank of volatile memory 120 as the current rank, and places all other ranks of volatile memory 120 other than the first rank into self-refresh mode. Flow proceeds to block 2128.

At block 2128, the memory controller 156 transfers partial data in the current rank of volatile memory 120 to a data buffer 224 between the volatile memory 120 and the non-volatile memory 116. In a preferred embodiment, the partial data is equal to the size of the data buffer 224. In other embodiments, the partial data is less than the size of the data buffer 224. Flow proceeds to block 2132.

At block 2132, the memory controller 156 places the current rank of volatile memory 120 into self-refresh mode. The volatile memory 120 consumes less power in self-refresh mode than in normal operation. Flow proceeds to block 2136.

At block 2136, the memory controller 156 transfers partial data from the data buffer 224 to the non-volatile memory 116. Once data is stored in the non-volatile memory 116, it is safe from any prolonged loss of main power 140. Flow proceeds to decision block 2140.

At decision block 2140, the memory controller 156 determines if the amount of partial data in the data buffer 224 is less than the data buffer threshold 1204. If the amount of partial data in the data buffer 224 is less than the data buffer threshold 1204, then there is no need to check the data buffer threshold 1204 in decision block 2144, and flow proceeds to decision block 2148 of FIG. 21b. If the amount of partial data in the data buffer 224 is not less than the data buffer threshold 1204, then flow proceeds to decision block 2144.

At decision block 2144, the memory controller 156 determines if the data buffer threshold 1204 has been reached. If the data buffer threshold 1204 has been reached, then flow proceeds to decision block 2148 of FIG. 21b. If the data buffer threshold 1204 has not been reached, then flow proceeds to block 2136 to continue transferring partial data from the data buffer 224 to the non-volatile memory 116.

Referring now to FIG. 21b, a flowchart illustrating a second part of a second multiple rank volatile memory 120 flush operation embodiment using a buffer threshold 1204 in accordance with the present invention is shown. Flow continues at block 2148.

At decision block 2148, the memory controller 156 determines if there is more flush data remaining in the current rank of volatile memory 120. If there is not more flush data remaining in the current rank of volatile memory 120, then flow proceeds to block 2164. If there is more flush data remaining in volatile memory 120, then flow proceeds to blocks 2152 and 2156.

At block 2152, the memory controller 156 transfers any remaining partial data in the data buffer 224 to non-volatile memory 116. Flow proceeds to block 2128 of FIG. 21a.

At block 2156, the memory controller 156 selects next partial data in the current rank of volatile memory 120. The next partial data is data in the current rank of volatile memory 120 that needs to be flushed to the non-volatile memory 116, and has not yet been flushed. Flow proceeds to block 2160.

At block 2160, the memory controller 156 takes the current rank of volatile memory 120 out of self-refresh mode. This prepares the current rank of volatile memory 120 for a next transfer of partial data from volatile memory 120 to the data buffer 224 in blocks 2128 through 2136. Flow proceeds to block 2128 of FIG. 21a to transfer next partial flush data.

At block 2164, the memory controller 156 places the current rank of volatile memory 120 into self-refresh mode, since the current rank contains no more data that needs to be flushed to the non-volatile memory 116. Flow proceeds to block 2192 and decision block 2168.

At decision block 2168, the memory controller 156 determines if the current rank of volatile memory 120 is the last rank of volatile memory 120 containing data that must be flushed to non-volatile memory 116. If the current rank of volatile memory 120 is the last rank of volatile memory 120 containing data that must be flushed to non-volatile memory 116, then no more data needs to be flushed from volatile memory 120 and flow proceeds to block 2172. If the current rank of volatile memory 120 is not the last rank of volatile memory 120 containing data that must be flushed to non-volatile memory 116, then more data needs to be flushed from volatile memory 120 and flow proceeds to blocks 2180 and 2184.

At block 2172, the memory controller 156 transfers any remaining partial data in the data buffer 224 to non-volatile memory 116. Flow proceeds to block 2176.

At block 2176, the volatile memory 120 data flush is completed, and all data in volatile memory 120 that must be flushed has been transferred to the non-volatile memory 116. At this point, the memory controller 156 asserts a flush completed 172 signal to the power manager 132. The flush completed 172 signal causes the power manager 132 to stop providing backup power 152 to selected power 164, in order to preserve remaining backup power 152 in the backup power source 136. This is generally a valuable feature for any backup power source 136, but especially non-rechargeable backup power sources 136 with a declining amount of available backup power 152. Flow ends at block 2176.

At block 2180, the memory controller 156 transfers any remaining partial data in the data buffer 224 to non-volatile memory 116. Flow proceeds to block 2128 of FIG. 21a.

At block 2184, the memory controller 156 selects a next rank of volatile memory 120 containing data that must be flushed as the current rank. Flow proceeds to block 2188.

At block 2188, the memory controller 156 places all other ranks of volatile memory 120 other than the current rank into self-refresh mode. Flow proceeds to block 2128 of FIG. 21a.

At block 2192, the memory controller 156 asserts a remove rank power signal 168 for the current rank of volatile memory 120 to the power manager 132. A separate remove rank power signal 168 is provided for each of the plurality of volatile memory 120 ranks, and an asserted signal commands the power manager 132 to remove backup power 152 from the corresponding volatile memory 120 rank. Flow proceeds to block 2196.

At block 2196, the power manager 132 removes backup power 152 from selected power 164 for the current rank of volatile memory 120. Flow ends at block 2196.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

We claim:

1. A method for providing reduced power consumption in a computer memory system, comprising:

transferring, by a memory controller coupled to a volatile memory, a non-volatile memory, and a buffer, first data from the volatile memory to the buffer, wherein the buffer stores less data than either of the volatile memory and the non-volatile memory, wherein the memory controller controls data transfers between the volatile memory, the buffer, and the non-volatile memory;

placing, by the memory controller, the volatile memory into self-refresh mode after transferring the first data to the buffer; and conveying, by the memory controller, the first data from the buffer to the non-volatile memory, wherein the amount of first data in the buffer exceeds a predetermined threshold, wherein while conveying the first data from the buffer to the non-volatile memory, the memory controller takes the volatile memory out of self-refresh mode when the amount of first data remaining in the buffer reaches the predetermined threshold, wherein the volatile memory is ready to transfer second data to the buffer when the memory controller is finished transferring the first data from the buffer to the non-volatile memory.

2. The method of claim 1, wherein the time to transfer an amount of data in the buffer equal to the predetermined threshold to the non-volatile memory is approximately equal to the time to transition the volatile memory out of self-refresh mode.

3. The method of claim 2, wherein the volatile memory comprises a plurality of volatile memory banks, wherein the first and second data are in a first volatile memory bank of the plurality of volatile memory banks, wherein the second data is the last data in the first volatile memory bank that needs to be flushed to the non-volatile memory, wherein third data that needs to be flushed to the non-volatile memory is in a second volatile memory bank of the plurality of volatile memory banks.

4. The method of claim 3, further comprising:
maintaining, by the memory controller, the plurality of volatile memory banks in self-refresh mode when data is not being accessed or prepared for access in the plurality of volatile memory banks, wherein all banks of the plurality of volatile memory banks except the bank transferring data to the buffer are in self-refresh mode.

5. The method of claim 3, further comprising:
transferring, by the memory controller, the second data from the first volatile memory bank to the buffer after conveying the first data from the buffer to the non-volatile memory.

6. The method of claim 5, wherein if the amount of second data is not greater than the predetermined threshold, after transferring the second data from the first volatile memory bank to the buffer:
placing, by the memory controller, the first volatile memory bank into self-refresh mode;
taking, by the memory controller, the second volatile memory bank out of self-refresh mode; and
conveying, by the memory controller, the second data from the buffer to the non-volatile memory.

7. The method of claim 5, wherein if the amount of second data is greater than the predetermined threshold, after transferring the second data from the first volatile memory bank to the buffer:
placing, by the memory controller, the first volatile memory bank into self-refresh mode; and
conveying, by the memory controller, the second data from the buffer to the non-volatile memory,
wherein while conveying the second data from the buffer to the non-volatile memory, the memory controller takes the second volatile memory bank out of self-refresh mode when the amount of second data remaining in the buffer reaches the predetermined threshold, wherein the volatile memory is ready to transfer third data to the buffer when the memory controller is finished transferring the second data from the buffer to the non-volatile memory.

8. The method of claim 5, wherein if the amount of second data is less than the size of the buffer, after transferring the second data from the first volatile memory bank to the buffer:
placing, by the memory controller, the first volatile memory bank into self-refresh mode;
taking the second volatile memory bank out of self-refresh mode, wherein if third data that needs to be flushed to the non-volatile memory is in the second volatile memory bank:
delaying, by the memory controller, transfer of the second data from the buffer to the non-volatile memory until the memory controller transfers third data from the second volatile memory bank to the buffer and either the buffer is full or there is not more third data available in the second volatile memory bank to transfer to the buffer.

9. The method of claim 3, further comprising:
providing, by a power manager coupled to the computer memory system, main power to the computer memory system when main power is available and backup power to the computer memory system when main power is not available.

10. The method of claim 9, further comprising:
receiving, by the power manager, an indication from the memory controller after the memory controller transfers the second data from the first volatile memory bank to the buffer; and
removing, by the power manager, backup power to the first volatile memory bank, after receiving the indication from the memory controller.

11. A computer memory system that flushes data from a volatile memory to a non-volatile memory when main power is lost to the computer memory system, comprising:
a volatile memory, wherein the volatile memory is in self-refresh mode;
a buffer, comprising first data, wherein the amount of first data in the buffer exceeds a predetermined threshold, wherein the buffer stores less data than either of the volatile memory and the non-volatile memory;
a non-volatile memory; and
a memory controller, coupled to the volatile memory, the buffer, and the non-volatile memory, wherein the memory controller controls data transfers between the volatile memory, the buffer, and the non-volatile memory, wherein the memory controller transfers the first data from the volatile memory to the buffer prior to placing the volatile memory in self-refresh mode,
wherein during a transfer of first data from the buffer to the non-volatile memory, when the amount of first data remaining in the buffer reaches the predetermined threshold, the memory controller takes the volatile memory out of self-refresh mode, wherein the volatile memory is ready to transfer second data to the buffer when the memory controller is finished transferring the first data from the buffer to the non-volatile memory.

12. The computer memory system of claim 11, wherein the time to transfer an amount of data in the buffer equal to the predetermined threshold to the non-volatile memory is approximately equal to the time to transition the volatile memory out of self-refresh mode.

13. The computer memory system of claim 12, wherein the volatile memory comprises a plurality of volatile memory banks, wherein the first and second data are in a first volatile memory bank of the plurality of volatile memory banks, wherein the second data is the last data in the first volatile memory bank that needs to be flushed to the non-volatile memory, wherein third data that needs to be flushed to the non-volatile memory is in a second volatile memory bank of the plurality of volatile memory banks.

14. The computer memory system of claim 13, wherein the memory controller maintains the plurality of volatile memory banks in self-refresh mode when data is not accessed in the plurality of volatile memory banks, wherein all banks of the plurality of volatile memory banks except the bank transferring data to the buffer are in self-refresh mode.

15. The computer memory system of claim 13, wherein the memory controller transfers the second data from the first volatile memory bank to the buffer after the memory controller transfers the first data from the buffer to the non-volatile memory.

16. The computer memory system of claim 15, wherein if the amount of second data is not greater than the predetermined threshold, the memory controller places the first volatile memory bank into self-refresh mode, takes the second volatile memory bank out of self-refresh mode, and transfers the second data from the buffer to the non-volatile memory.

17. The computer memory system of claim 15, wherein if the amount of second data is greater than the predetermined threshold, the memory controller places the first volatile memory bank into self-refresh mode and transfers the second data from the buffer to the non-volatile memory.

18. The computer memory system of claim 15, wherein if the amount of second data is less than the size of the buffer, the memory controller places the first volatile memory bank into self-refresh mode and takes the second volatile memory bank out of self-refresh mode, wherein if third data that needs to be flushed to the non-volatile memory is in the second volatile memory bank, the memory controller delays transferring the second data from the buffer to the non-volatile memory until the memory controller transfers third data from the second volatile memory bank to the buffer and either the buffer is full or there is not more third data available in the second volatile memory bank to transfer to the buffer.

19. The computer memory system of claim 13, further comprising:
    a power manager, coupled to the computer memory system, wherein the power manager provides main power to the computer memory system when main power is available, wherein the power manager provides backup power to the computer memory system when main power is not available.

20. The computer memory system of claim 19, wherein after transferring the second data from the first volatile memory bank to the buffer, the memory controller provides an indication to the power manager, wherein in response to receiving the indication from the memory controller, the power manager foregoes providing backup power to the first volatile memory bank.

* * * * *